United States Patent
Martin et al.

(10) Patent No.: US 7,340,693 B2
(45) Date of Patent: Mar. 4, 2008

(54) SYSTEM FOR DESIGNING RE-PROGRAMMABLE DIGITAL HARDWARE PLATFORMS

(76) Inventors: Nick Martin, 4 Kinks Road, Terrey Hills, NSW 2084 (AU); Dejan Stankovic, 84/8 Koorala Street, Manly Vale, NSW 2093 (AU); Ben Wells, 8 Clematis Close, Cherrybrook, NSW 2126 (AU); Denzil Crasta, 20/5A Pitt Street, Balgowlah, NSW 2093 (AU); Johnny F. Russell, Apartment 5, 1 Castray Esplanade, Battery Point, Tasmania 7004 (AU); Michael Rodway, 102 Old Station Road, Snug, Tasmania 7054 (AU)

( * ) Notice: Subject to any disclaimer, the term of this patent is extended or adjusted under 35 U.S.C. 154(b) by 260 days.

(21) Appl. No.: 11/066,070

(22) Filed: Feb. 24, 2005

(65) Prior Publication Data

US 2006/0190905 A1 Aug. 24, 2006

(51) Int. Cl.
*G06F 17/50* (2006.01)

(52) U.S. Cl. .................. 716/1; 716/4; 716/16; 716/18

(58) Field of Classification Search .................. 716/1, 716/4–5, 16–18
See application file for complete search history.

(56) References Cited

U.S. PATENT DOCUMENTS

| | | | |
|---|---|---|---|
| 5,991,523 A * | 11/1999 | Williams et al. | 716/18 |
| 6,324,672 B1 * | 11/2001 | Lawman et al. | 716/1 |
| 6,460,172 B1 * | 10/2002 | Insenser Farre et al. | 716/17 |
| 2001/0034876 A1 * | 10/2001 | Panchul et al. | 716/18 |
| 2003/0182642 A1 * | 9/2003 | Schubert et al. | 716/4 |

* cited by examiner

*Primary Examiner*—Paul Dinh
(74) *Attorney, Agent, or Firm*—Russo & Hale LLP; William C. Milks, III

(57) ABSTRACT

A digital design system and method are provided for re-programmable hardware platforms, such as field programmable gate arrays (FPGAs) and other re-programmable system designs. The design system and method bridge the gap between what has previously been a development and prototyping platform used during the design phase of an electronic design system (EDS) project, and commercially viable re-programmable product platforms to replace non-programmable platforms, such as discrete processors and ASICs.

24 Claims, 25 Drawing Sheets

| | | | | | | |
|---|---|---|---|---|---|---|
| ⊟ 📁 Edif | | | | | | |
| ⊟ 📁 Actel | | | | | | |
| 📁 Proasicplus | 📁 Lcd16x2a | 8 KB | Compressed (zipped) Folder | 4/02/2004 2:37 PM | | |
| ⊟ 📁 Altera | 📁 Max1104_dac | 4 KB | Compressed (zipped) Folder | 4/02/2004 2:37 PM | | |
| 📁 Cyclone | 📁 Prtio1x8 | 2 KB | Compressed (zipped) Folder | 29/01/2004 7:28 PM | | |
| 📁 Max3000a | 📁 Prtio2x8 | 3 KB | Compressed (zipped) Folder | 29/01/2004 7:28 PM | | |
| 📁 Max7000ae | 📁 Prtio4x8 | 4 KB | Compressed (zipped) Folder | 29/01/2004 7:28 PM | | |
| 📁 Max7000b | 📁 Prtiox1x8 | 3 KB | Compressed (zipped) Folder | 29/01/2004 7:28 PM | | |
| 📁 Max7000s | 📁 Prtiox2x8 | 4 KB | Compressed (zipped) Folder | 29/01/2004 7:28 PM | | |
| 📁 Stratix | 📁 Prtiox4x8 | 6 KB | Compressed (zipped) Folder | 29/01/2004 7:28 PM | | |
| ⊟ 📁 Xilinx | 📁 Prto1x8 | 2 KB | Compressed (zipped) Folder | 29/01/2004 7:28 PM | | |
| 📁 Coolrunner2 | 📁 Prto2x8 | 2 KB | Compressed (zipped) Folder | 29/01/2004 7:28 PM | | |
| 📁 Coolrunnerxpla3 | 📁 Prto4x8 | 3 KB | Compressed (zipped) Folder | 29/01/2004 7:28 PM | | |
| 📁 Spartan2 | 📁 Ps2 | 13 KB | Compressed (zipped) Folder | 5/02/2004 4:08 PM | | |
| 📁 Spartan2e | 📁 Srio | 20 KB | Compressed (zipped) Folder | 9/01/2004 12:45 PM | | |
| 📁 Spartan3 | 📁 Tmr3 | 12 KB | Compressed (zipped) Folder | 9/01/2004 12:45 PM | | |
| 📁 Virtex | 📁 Tsk51a | 140 KB | Compressed (zipped) Folder | 21/01/2004 10:35 AM | | |
| 📁 Virtex2 | Tsk51a_d | 182 KB | Compressed (zipped) Folder | 21/01/2004 10:35 AM | | |

| Name ▲ | Type | Packed Size | Has a password | Size | Ratio | Date |
|---|---|---|---|---|---|---|
| RAM256x8_TSK51D | Altium EDIF Document | 2 KB | Yes | 11 KB | 85% | 7/01/2004 4:06 PM |
| TSK51A_D | Altium EDIF Document | 180 KB | Yes | 2,20... | 92% | 7/01/2004 4:06 PM |

| | | | | |
|---|---|---|---|---|
| 📁 Tsk165b | 46 KB | Compressed (zipped) Folder | 9/01/2004 12:45 PM | |
| 📁 Tsk165b_d | 85 KB | Compressed (zipped) Folder | 9/01/2004 12:45 PM | |
| 📁 Tsk165c | 53 KB | Compressed (zipped) Folder | 9/01/2004 12:45 PM | |
| 📁 Tsk165c_d | 98 KB | Compressed (zipped) Folder | 9/01/2004 12:45 PM | |
| 📁 Vga | 33 KB | Compressed (zipped) Folder | 9/01/2004 12:46 PM | |

Figure 6

```
;.............................................................
;Constraints File
;    Device  : Altera Cyclone EP1C12Q240C6
;    Board   : NanoBoard NB1 Revision-4 with Plug-In Daughter Board
;    Project : Any
;
;    Created 21-November-2003
;    Altium Limited
;.............................................................

;.............................................................
Record=FileHeader | Id=DXP Constraints v1.0
;.............................................................

;.............................................................
Record=Constraint | TargetKind=PCB  | TargetId=NanoBoard NB1 Revision-4
Record=Constraint | TargetKind=Part | TargetId=EP1C12Q240C6
;.............................................................
```

Figure 8

| Constraint Files | Configurations | | |
|---|---|---|---|
| Constraint Filename | Cyclone12_NB1 | Spartan300_NB1 | MyProject |
| CoolRunner.Constraint | ☐ | ☐ | ☑ |
| NB1_3_EP1C12Q240.Constraint | ☑ | ☐ | ☐ |
| NB1_3_XC2S300E-6PQ208.Constraint | ☐ | ☑ | ☐ |

Figure 12

| Results Summary | |
|---|---|
| Device Resources - Usage Summary | |
| 4-Input LUTs - Logic | 2,990 / 6,144    48% |
| 4-Input LUTs - Total | 3,177 / 6,144    51% |
| Block RAMs | 5 /    16    31% |
| Global Clock I/O Buffers | 1 /     4    25% |
| Global Clocks | 2 /     4    50% |
| I/O Pins | 27 /   142    19% |
| Slice Flip Flops | 1,265 / 6,144    20% |
| Slices with only related logic | 2,176 / 2,176   100% |
| Slices with unrelated logic | 0 / 2,176    0% |
| Slices | 2,176 / 3,072    70% |
| Tbufs | 16 / 3,200    1% |

☑ Show Results Summary dialog     Note: The Results Summary also appears in the Output panel

[Print...]  [Copy]                                      [Close]

Figure 15

For the Spartan 2E300 on the NanoBoard

For the Cyclone EP1C12 on the NanoBoard

For the Spartan 2E100 on a User Board

SYSTEM FOR DESIGNING RE-PROGRAMMABLE DIGITAL HARDWARE PLATFORMS

BACKGROUND OF THE INVENTION

1. Field of the Invention

The present invention relates generally to a system and method for designing digital circuits and, more particularly, to a system and method for designing re-programmable digital circuits.

2. Description of the Prior Art

Until recently, it has been difficult to substitute programmable devices for non-programmable design approaches for a number of reasons. These reasons include the following:

1. Programmable devices are more expensive on a per-unit basis than the dedicated circuitry they replace.
2. Programmable devices operate more slowly than discrete circuitry.
3. Programmable devices are inherently less power-efficient than discrete circuitry.
4. System implementation on programmable hardware is inherently more difficult than on non-programmable platforms.

At present, these factors have generally relegated programmable logic to three common applications:

1. Using the programmable device as a development and prototyping platform during the design phase of a project.
2. Using the programmable device for specialized, low-volume or high-value applications in which programmability and re-programmability benefits outweigh the cost or efficiency penalties imposed by their use.
3. Using low-capacity and/or low-cost "commodity" programmable devices to replace a limited amount of the digital circuit, allowing custom, or so-called "glue logic," to support conventional non-programmable discrete circuitry for a specific application.

Typically, once the market size for a particular product reaches a certain level, developers have the option to move custom circuitry onto an Application Specific Integrated Circuit (ASIC). Implementing the bulk of a complex digital system onto a dedicated ASIC provides very high performance and efficiency at very low per-unit cost. However, as ASIC manufacturing has moved to ever smaller geometries, following the principle of Moore's Law, the design and tooling costs have risen to the level at which many applications cannot currently support this move to dedicated silicon.

The same technology that has made ASIC design more difficult and expensive has benefited Field Programmable Gate Array (FPGA) design. Moving FPGAs to these smaller geometries (currently 90 nm) enables them to be smaller, faster, more efficient, and less expensive. The leaders in FPGA technology, Xilinx and Altera, are now competing aggressively in an emerging "commodity FPGA" marketplace, offering high-capacity FPGAs at prices that are a full order of magnitude lower than the previous generation.

As a result, it is now possible to design complex digital systems that are hosted almost entirely inside a re-programmable device at a deliverable price. The potential benefits of designing on a re-programmable platform include:

1. Shorter time-to-design with no delay while prototyping or tooling for mass production;
2. Lower development cost with no tooling or prototyping costs;
3. Lower development risk without need to scrap defective tooling and providing the ability to re-design on the fly; and
4. In-field upgradability after a product is delivered.

However, before these benefits can be realized, the problem of implementing complex hardware and software systems on a re-programmable platform must be addressed. While many engineers look to FPGA technology to provide higher levels of on-chip integration and a lower risk alternative to the cost and lead time of conventional ASICs, system-level design on an FPGA platform is a difficult exercise, particularly when it comes to bringing the processor into the FPGA.

Presently, the design of such ambitious "system scale" designs has required the same level of design expertise as the design of ASICs. The skill, knowledge, and technology resources required for this level of design are largely restricted to large enterprises. For example, these designs are normally rendered in a highly cumbersome textual hardware description language (HDL). This language is an efficient vehicle for component, or micro-level, logic, but becomes unwieldy when applied at the systems level. Another problem is system verification, in which elaborate test strategies must be employed in order to simulate the operation of a complex system prior to its implementation.

Thus, it would be desirable to provide a design system and method for re-programmable digital platforms which overcome the above limitations and disadvantages of conventional systems and techniques and facilitate the design of re-programmable digital platforms. It would also be desirable to provide re-programmable system design that is attainable for the broadest potential market, and to overcome a number of problems in re-programmable design implementation. It is to this end that the present invention is directed. Overcoming these obstacles has resulted in several novel solutions that have no precedent in the electronics design automation domain. The various embodiments of the present invention provide many advantages over conventional design systems and methods.

SUMMARY OF THE INVENTION

One embodiment of the design system and method in accordance with the present invention provides many advantages over conventional design systems and techniques, which make the design system and method in accordance with the present invention more useful to digital circuit designers. The design system and method for re-programmable digital platforms in accordance with the present invention are based on a realization that the potential benefits of re-programmable hardware platforms, such as FPGAs, potentially outweigh the historic disincentives that have inhibited their wider adoption for digital systems.

In accordance with the present invention, a digital design system and design process are provided for re-programmable hardware platforms, such as FPGAs and other re-programmable system designs. The design system and process bridge the gap between what has previously been a development and prototyping platform used during the design phase of an electronic design system (EDS) project, and commercially viable programmable product platforms to replace non-programmable platforms, such as discrete processors and ASICs.

The approach employed by one embodiment of the design system and method for re-programmable digital platforms in accordance with the present invention is based on a process of translating the required design process back into models which are familiar and intuitively manageable by most electronics engineers. This allows users of the design system and method for re-programmable digital platforms in accordance with the present invention to design as if they are using discrete components, for example, processors and peripheral devices, in order to build complex systems with schematic symbology traditionally used with EDS. The design system and method for re-programmable digital platforms in accordance with the present invention require complex background automation in order to maintain the high-level abstraction of the design at the level of user interaction. Symbolic, component level logical blocks are provided to the user, such as a system design engineer. This generic logic can be quickly assembled into complex systems. The user does not need to write any RTL- or netlist-level descriptions, as these are managed automatically by the design environment. The pre-synthesis of these component-level blocks is enabled by a system that allows components to be symbolically rendered and interconnected within a supporting graphical design environment. The pre-synthesized components are supplied as object code entities without having to expose the underlying RTL- or netlist-level source code. The system includes a library having a comprehensive set of "components" that can be used by the user to add functionality to the design. These range from simple gate-level functional blocks to high-level hardware, such as multipliers and pulsewidth modulators, as well as high-level functions, such as microprocessors and communication functions. The design system and method for re-programmable digital platforms in accordance with the present invention manages the resources to instantiate the design in the target device.

The design system and method for re-programmable digital platforms in accordance with one embodiment of the present invention automatically re-target a generic design for a selected programmable device transparently around each different tool chain and provide a generic view of the process flow to the user. This enables users to only have to learn one process flow in order to use multiple different vendors' tool chains, and allows easy movement between different digital devices from different vendors to easily port their designs to new target devices.

One embodiment of the design system and method for re-programmable digital platforms in accordance with the present invention also automatically manages device-specific design constraints by providing a generic constraint model in which constraints can be specified. The design system and method for re-programmable digital platforms in accordance with the present invention transparently map these to the vendor-specific constraint system for implementation. For the minority of cases in which there are constraints that do not make sense for any other device, the design system and method for re-programmable digital platforms in accordance with the present invention allow these also to be specified in a generic way, but they then only map to specific devices.

The design system and method for re-programmable digital platforms in accordance with one embodiment of the present invention employ a development platform for interactive, re-targetable hardware and software co-design of programmable device hosted systems by utilizing a device referred to as a NanoBoard to allow a single development platform to provide development resources for an unlimited number of target devices, such as FPGAs, CPLDs, or embedded microprocessors, from one or more different semiconductor manufacturers. The NanoBoard also contains a controller device that manages communications with the host-based development software, the daisy-chaining of multiple NanoBoards, connections to user-designed boards, and interfaces to physical resources on the NanoBoard. This device uses a so-called "NanoTalk" protocol to communicate with the PC-based software and to communicate with other NanoBoards in the daisy chain. Preferably, the clock frequency may be the controlled by the host-based development software. Each NanoBoard also contains one or more standard sockets for installing devices that may be used for development. These so-called daughter boards generate an identification code that is read by the controller which can then program the device at power-up. Preferably, the system for re-programmable digital platforms in accordance with one embodiment of the present invention comprises a programmable power supply for accommodating daughter boards with different power rail requirements.

One embodiment of the design system and method for re-programmable digital platforms in accordance with the present invention provides an interactive design environment that automates support for multiple development boards. Each development board has a master and slave connector that allows an unlimited number of development boards to be daisy chained together. When another board is connected into the daisy chain, it is automatically recognized, and all of its resources become available to the system. This is controlled by a NanoTalk controller that detects the presence of the new board and then brings all of its hard devices into the main hard-chain, and all of its soft devices into the main soft-chain. The NanoTalk controller on each board can then be accessed from the PC-based software system to control the individual resources located on each development board. This system uses a single pin on a header to allow another board with JTAG devices to be automatically brought into the main JTAG chain. A protocol for multiplexed JTAG/SPI channels is used, in which the system allows a single interface between the PC and the development platform to control multiple JTAG and SPI chains. Other than the standard JTAG pins, a single mode pin is used to control the system.

The design system and method for re-programmable digital platforms in accordance with one embodiment of the present invention preferably have a generic boot system capable of supporting multiple programmable device architectures, which allows a single controller and a generic low-cost serial flash RAM device to be used to program multiple different target devices. The daughter boards that are plugged into the system generate an identification code that is used by the controller to identify the device. At power-up, the controller identifies the target device, reads the data stream from the serial flash device, and programs the device using a programming algorithm that is appropriate for that target device.

The design system and method for re-programmable digital platforms in accordance with the various embodiments of the present invention constitute a radical reconsideration of the digital system design process. The design system and method for re-programmable digital platforms in accordance with the present invention enable the design of FPGAs and other emerging re-programmable hardware architectures to ultimately replace non-programmable digital platforms, such as discrete processors and ASICs, as deliverable product platforms.

The foregoing and other objects, features, and advantages of the present invention will become more readily apparent from the following detailed description of various embodiments, which proceeds with reference to the accompanying drawing.

BRIEF DESCRIPTION OF THE DRAWING

The various embodiments of the present invention will be described in conjunction with the accompanying figures of the drawing to facilitate an understanding of the present invention. In the figures, like reference numerals refer to like elements. In the drawing:

FIG. 6 shows pre-synthesized EDIF models allowing for vendor-independent design using the re-programmable digital platform design system in accordance with one embodiment of the present invention;

FIG. 8 illustrates specifying a target device in a constraint file using the re-programmable digital platform design system in accordance with one embodiment of the present invention;

FIG. 12 illustrates adding the relevant constraint file to the required configuration using the re-programmable digital platform design system in accordance with one embodiment of the present invention;

FIG. 15 illustrates summarizing resource usage for a chosen device using the re-programmable digital platform design system in accordance with one embodiment of the present invention;

DETAILED DESCRIPTION OF THE PREFERRED EMBODIMENTS

The present invention is particularly applicable to a software-and-hardware-based re-programmable digital platform design system, and it is in this context that the various embodiments of the present invention will be described. It will be appreciated, however, that the re-programmable digital platform design system and method in accordance with the present invention have greater utility, since they may be implemented in different proportions of software and hardware or may incorporate other modules or functionality not described herein.

Figure 1:
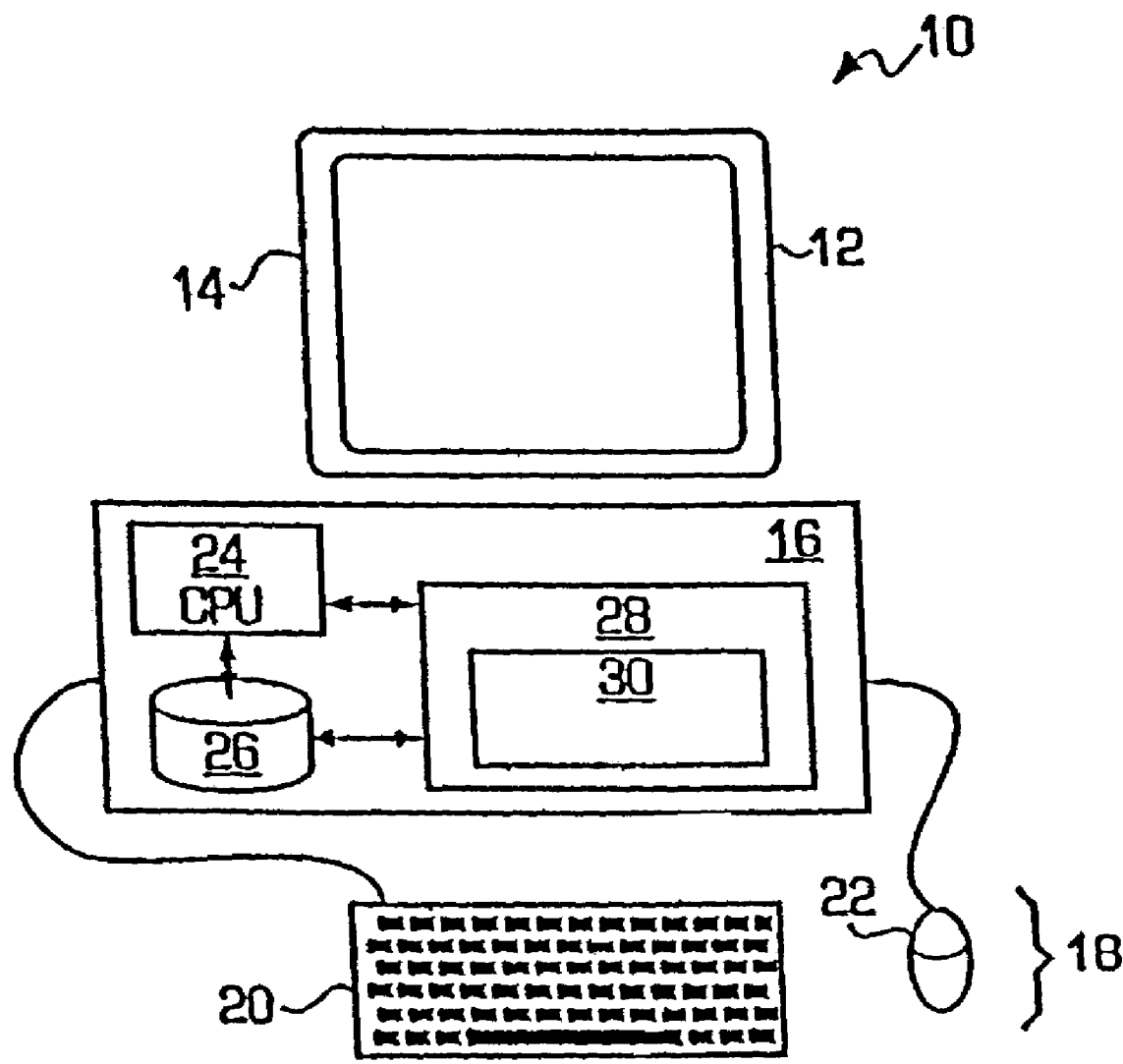
FIG. 1 is a block diagram illustrating an example of a re-programmable digital platform design system in accordance with one embodiment of the present invention.

FIG. 1 is a block diagram illustrating an example of a re-programmable digital platform design system 10 in accordance with one embodiment of the present invention implemented on a personal computer (PC) 12. In particular, the PC 12 may include a display unit 14, which may be a cathode ray tube (CRT), a liquid crystal display, or the like; a processing unit 16; and one or more input/output devices 18 that permit a user to interact with the software application being executed by the PC. In the illustrated example, the input/output devices 18 may include a keyboard 20 and a mouse 22, but may also include other peripheral devices, such as printers, scanners, and the like. The processing unit 16 may further include a central processing unit (CPU) 24, a persistent storage device 26, such as a hard disk, a tape drive, an optical disk system, a removable disk system, or the like, and a memory 28. The CPU 24 may control the persistent storage device 26 and memory 28. Typically, a software application may be permanently stored in the persistent storage device 26 and then may be loaded into the memory 28 when the software application is to be executed by the CPU 24. In the example shown, the memory 28 may contain a re-programmable digital platform design tool 30. The re-programmable digital platform design tool 30 may be implemented as one or more software modules that are executed by the CPU 24.

In accordance with the present invention, the re-programmable digital platform design system 10 may also be implemented using hardware and may be implemented on different types of computer systems, such as client/server systems, Web servers, mainframe computers, workstations, and the like. Now, more details of an exemplary implementation of the re-programmable digital platform design system 10 in software and hardware will be described.

Current digital circuit design tools are primarily HDL-based and not well integrated with embedded software tools. One embodiment of the re-programmable digital platform design system 10 in accordance with the present invention is leveraged from "Board-on-Chip" technology that consists of a design technology that brings together software and hardware design processes in a single, integrated design environment to enable users to employ board-level methodologies to design and implement embedded systems on FPGAs. This technology enables users to employ board-level design methodologies to both design and implement an entire digital system, including embedded microprocessor cores and the software that runs on them, onto an FPGA. The "Board-on-Chip" design technology enables users to employ familiar design methodologies to harness the power of FPGAs as a design platform and provides users the power to transition board designs directly into FPGAs. The re-programmable digital platform design system 10 and method in accordance with the present invention enable rapid implementation and testing of complete digital systems on FPGAs without the need for HDL source files or extensive synthesis and verification.

In order to facilitate "Board-on-Chip" design, technology from a full range of EDA and embedded products has been brought together. Preferably, nVisage multi-dimensional design capture and TASKING embedded software technologies (including Viper multi-core compiler and debugger technologies) have been combined on the Design Explorer (DXP) platform available from Altium Limited to provide a single, integrated hardware design and software development environment. This environment enables:

Mixed schematic/RTL-level HDL design capture;
Integrated software development;
Processor core packs that combine pre-synthesized processor cores with matching compiler, simulator, and debugger;
Schematic component libraries containing a range of pre-synthesized components including common peripheral devices, generic logic, and a range of communication and interface components;
Primitives and macro libraries for all Xilinx and Altera device families;
Virtual instruments, such as logic analyzers and frequency counters, that can be built into the design for test purposes; and
A "Board-on-Chip" development board loaded with an FPGA that functions as a breadboard and allows implementation of the design directly from the user's PC 12 onto the FPGA.

The "Board-on-Chip" technology provides a fully integrated and self-contained system for FPGA-based design that is accessible to users.

Generally, software tends to remain fluid throughout the development process because it is easy to update and change. Hardware, on the other hand, tends to be locked down early in the process, because of time and cost involved in each hardware iteration and the fact that the board needs to be available in order to finalize software development.

One of the most significant benefits of "Board-on-Chip" technology is that it allows a more flexible approach to partitioning the design between hardware and software. Users retain the ability to choose a hardware or software solution to any particular problem throughout the design process, thereby providing true parallel development of hardware and software. Also, the inclusion of a targeted development board allows hardware dependencies in the software to be addressed before the target hardware is finalized.

Using the "Board-on-Chip" technology with its reconfigurable FPGA-based hardware platform, hardware updates can be made as easily as software updates. This makes it possible to continue to explore different hardware options throughout the design process and allows final hardware/software partitioning decisions to be delayed until late in the development process.

The re-programmable digital platform design system 10 in accordance with the present invention provides a systems focus to FPGA design. The re-programmable digital platform design system 10 provides an out-of-the-box design environment for architecting entire embedded systems on FPGAs.

The re-programmable digital platform design system 10 provides a comprehensive, vendor-independent solution for system-level design on an FPGA platform derived from the Board-on-Chip technology described above. The re-programmable digital platform design system 10 integrates hardware design tools, embedded software development tools, IP-based components, virtual instrumentation, and a reconfigurable development board to allow users, even those without HDL experience, to interactively design and implement a complete embedded system inside an FPGA.

The benefits that the re-programmable digital platform design system 10 provides to users include parallel design of hardware and software, greater flexibility in hardware/software design partitioning, an integrated FPGA vendor-independent solution for putting entire embedded systems into FPGAs, and a "live," interactive design environment for system-on-FPGA development and debug.

The re-programmable digital platform design system 10 is a complete system-on-FPGA design environment built upon "live" real-time, hands-on engineering that happens inside the physical hardware design space using an approach that maps directly to a user's existing knowledge of system-level design. The re-programmable digital platform design system 10 environment is complete and ready to use, with design hardware, design software, and IP.

The re-programmable digital platform design system 10 employs proven board-level system design methodologies and retargets them for FPGA architectures. The re-programmable digital platform design system 10 also integrates hardware design and software development within a single environment to provide a total solution to systems design. The result is a system-on-FPGA tool that allows risk-free chip-level systems integration, practical hardware/software co-design, a complete systems-level development environment for FPGA-based embedded design, and introduces an interactive design methodology referred to as LiveDesign that is accessible to users.

At the system level, the re-programmable digital platform design system 10 provides a schematic-based design methodology to define system connectivity. This enables graphical schematic-based capture which is more efficient for connecting functional blocks than HDLs and allows complex systems to be created quickly at the component level.

Schematic design is preferably facilitated in the re-programmable digital platform design system 10 by the inclusion of extensive libraries of royalty-free, pre-synthesized, pre-verified IP components, including a range of processor cores, that can be simply dropped onto the schematic and connected together to form the system hardware. This is analogous to the way designers currently work at the board level with physical, "off-the-shelf" components.

The re-programmable digital platform design system 10 components are processed for a variety of target FPGA architectures from multiple vendors. This allows design portability between FPGA device families and ensures a flexible vendor-independent approach to FPGA design. The re-programmable digital platform design system 10 automatically and transparently selects the correct component model for the target architecture during system synthesis. As a result, designs can be synthesized very quickly, because the component IP does not need to be reprocessed during synthesis. The re-programmable digital platform design system 10 component system provides a novel and secure framework for FPGA IP delivery that avoids the security problems associated with supplying IP as HDL source code.

Along with IP components, the re-programmable digital platform design system 10 includes a library of IP-based virtual instruments, such as logic analyzers, frequency counters/generators, and IO monitors, that can be incorporated into the design at the schematic level to facilitate system debugging. Like the IP components, the virtual instruments are supplied as pre-synthesized models that allow them to be used across FPGA target architectures.

These instruments have on-screen front panels analogous to their physical counterparts to provide an intuitive way for users to examine the operation of their circuit, and to "see" inside the FPGA during the design process. Preferably integral to the re-programmable digital platform design system 10 is a versatile FPGA-based development board called a NanoBoard that provides a reconfigurable platform for implementing and debugging the design. The NanoBoard is connected to the user's PC 12 and uses JTAG-based communications to both download the design to the onboard FPGA, and to interact with processor cores and instruments in the design once it has been downloaded.

Target FPGAs are housed on plug-in daughter boards to allow easy retargeting of designs. Multiple NanoBoards can be daisy-chained together to facilitate the design of complex multi-FPGA systems, and can accommodate the inclusion of end-user boards into the system for final production PCB testing and debugging.

To facilitate system software development, the re-programmable digital platform design system 10 includes a complete set of software development tools for all supplied processor cores to enable integrated software development. Using the Viper reconfigurable compiler technology, the re-programmable digital platform design system 10 provides high-quality code development and debugging that is fully integrated with the hardware development environment.

Once the target design has been downloaded to the NanoBoard, all processors in the design can be controlled and debugged from within the re-programmable digital platform design system 10. This enables software development to take place directly on the target hardware from early in the design cycle, supporting parallel development of hardware and software. Hardware designers can download their designs to the NanoBoard for interactive debugging during development, and software designers can develop their program code directly on the hardware beginning early in the design cycle.

Because hardware can be updated with the same ease as the software, the re-programmable digital platform design system 10 allows more flexible design partitioning. Implementing the design on the NanoBoard means a physical prototype is not required to support completion of the debug process, so that the need to finalize hardware can be delayed until later in the development cycle.

The re-programmable digital platform design system 10 interactive system design environment and ability to directly connect designers and developers with their designs allows users to adopt a very hands-on approach to the development process. This provides a so-called LiveDesign design methodology.

Unlike conventional electronics design flows, LiveDesign-enabled tools represent a new methodology for hardware and software system process flows. The LiveDesign electronics development methodology supports real-time, on-the-fly design and debug of a physical circuit with benefits for design speed, flow, quality, and cost.

The LiveDesign methodology also enables system implementation for debug purposes, minimizing the reliance on time-consuming system-level simulation required by other design flows. There is little time or cost penalty involved in multiple design iterations, enabling users to try different design solutions without the need to physically manufacture prototype boards.

Considered in more detail, the re-programmable digital platform design system and method in accordance with the various embodiments of the present invention bridge the gap between what has previously been a development and prototyping platform used during the design phase of an EDS project, and commercially viable re-programmable product platforms to replace non-programmable platforms, such as discrete processors and ASICS. The re-programmable digital platform design system 10 and method in accordance with one embodiment of the present invention provide for packaging, certification, and secure delivery of IP components.

The approach employed by the re-programmable digital platform design system 10 and method in accordance with one embodiment of the present invention is based on a process of translating the required design process back into models which are familiar and intuitively manageable by most users. This allows users of the re-programmable digital platform design system 10 and method to design as if they are using discrete components, such as processors and peripheral devices, in order to build complex systems with schematic symbology used traditionally with EDS.

The design environment of the re-programmable digital platform design system 10 and method enables a user to design, implement, and debug a digital design in an FPGA. The design is captured as a schematic, or using a mixture of schematic and RTL-level HDL. The embedded software is written in a coding-aware editor, ready for compilation and download.

Figure 2:
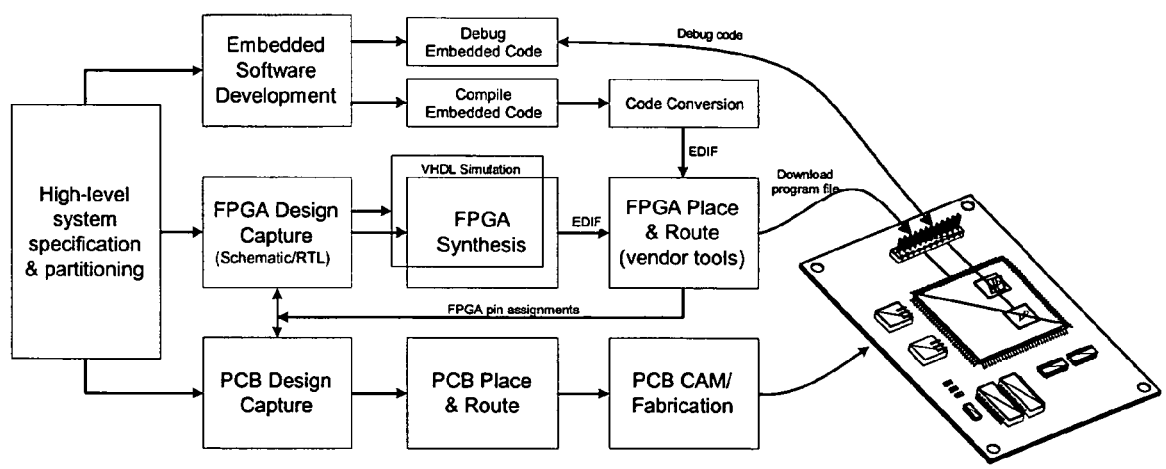
FIG. 2 is a system diagram showing the flow of the hardware design, embedded software, and PCB design of the re-programmable digital platform design system in accordance with one embodiment of the present invention.

FIG. 2 is a block diagram showing the flow of the hardware design, embedded software, and PCB design of the re-programmable digital platform design system 10 and method in accordance with one embodiment of the present invention. As shown in FIG. 2, once a hardware design is complete, it is synthesized, a process that transforms it from the capture form into a low-level gate form.

After design synthesis, a place and route is performed, a process during which device-aware software implements the design in the target FPGA. The vendor-specific place and route software required to synthesize for the target architecture is operated by the DXP environment, which automatically manages all project and file handling aspects required to generate an FPGA program file.

To test and debug the design, the re-programmable digital platform design system 10 includes a NanoBoard, an implementation platform that includes an FPGA, as well as an array of general purpose peripheral components. The software communicates directly with the NanoBoard via a port on the PC 12, programming the FPGA and implementing a design by a user.

Once the design has been implemented on the NanoBoard, the design can be debugged, using virtual instruments and boundary scan pin status technology to debug the hardware, and an integrated debugger for the embedded software. Since debugging is performed from within the same environment in which the design is captured, design iterations can be carried out quickly and software/hardware solutions rapidly explored.

Figure 3:
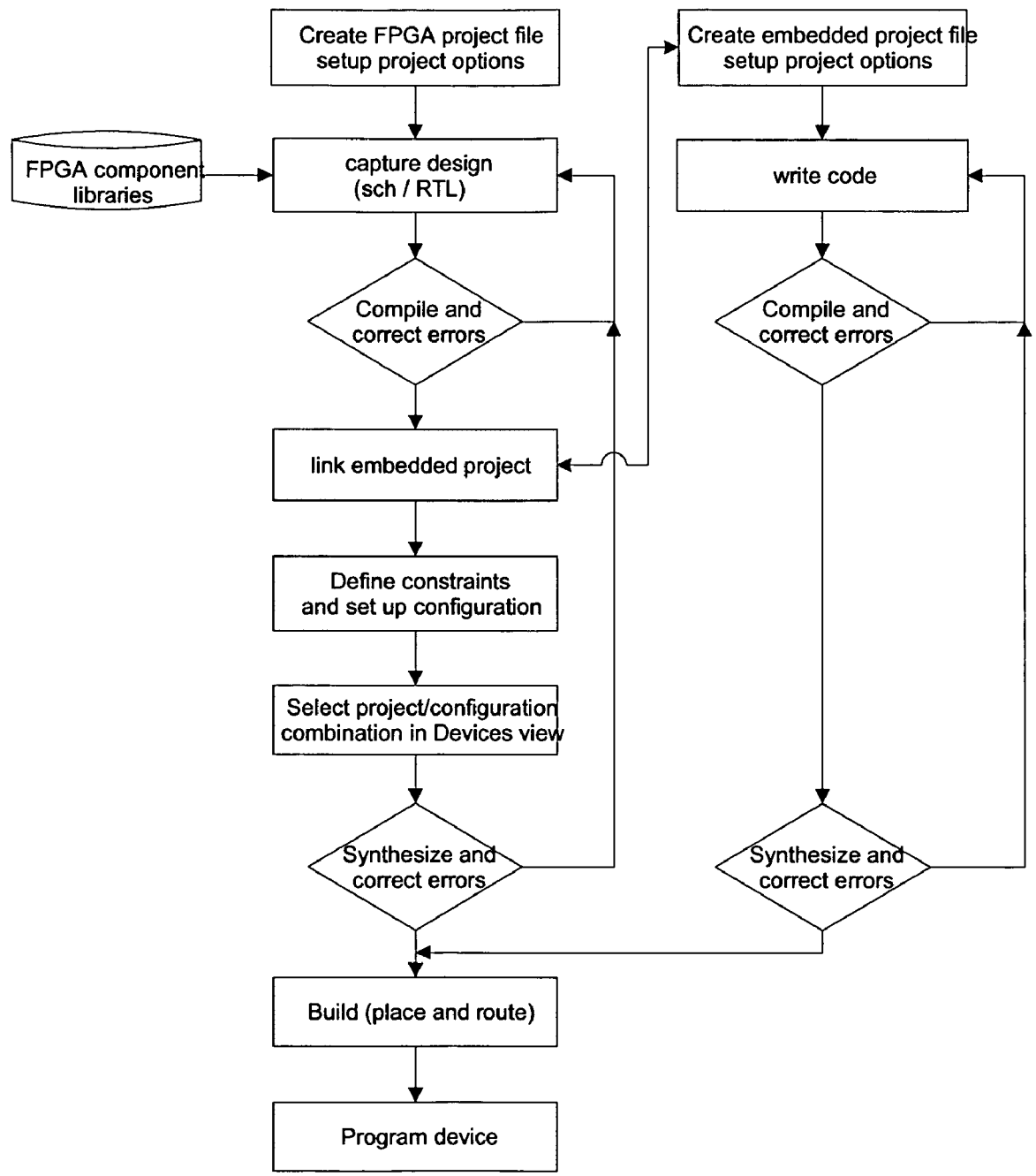
FIG. 3 is a flow diagram of the overall re-programmable digital platform design method in accordance with one embodiment of the present invention.

FIG. 3 is a flow diagram of the overall re-programmable digital platform design method in accordance with one embodiment of the present invention. The re-programmable digital platform design method provides a graphical design environment that employs symbolic, component-level logical blocks for selection by the user. This generic logic can be quickly assembled into complex systems. The user does not need to write any RTL- or netlist-level descriptions, as these are managed automatically by the design environment. The pre-synthesis of these component-level blocks is enabled by a module that allows components to be symbolically rendered and interconnected within a supporting graphical design environment.

Figure 4:
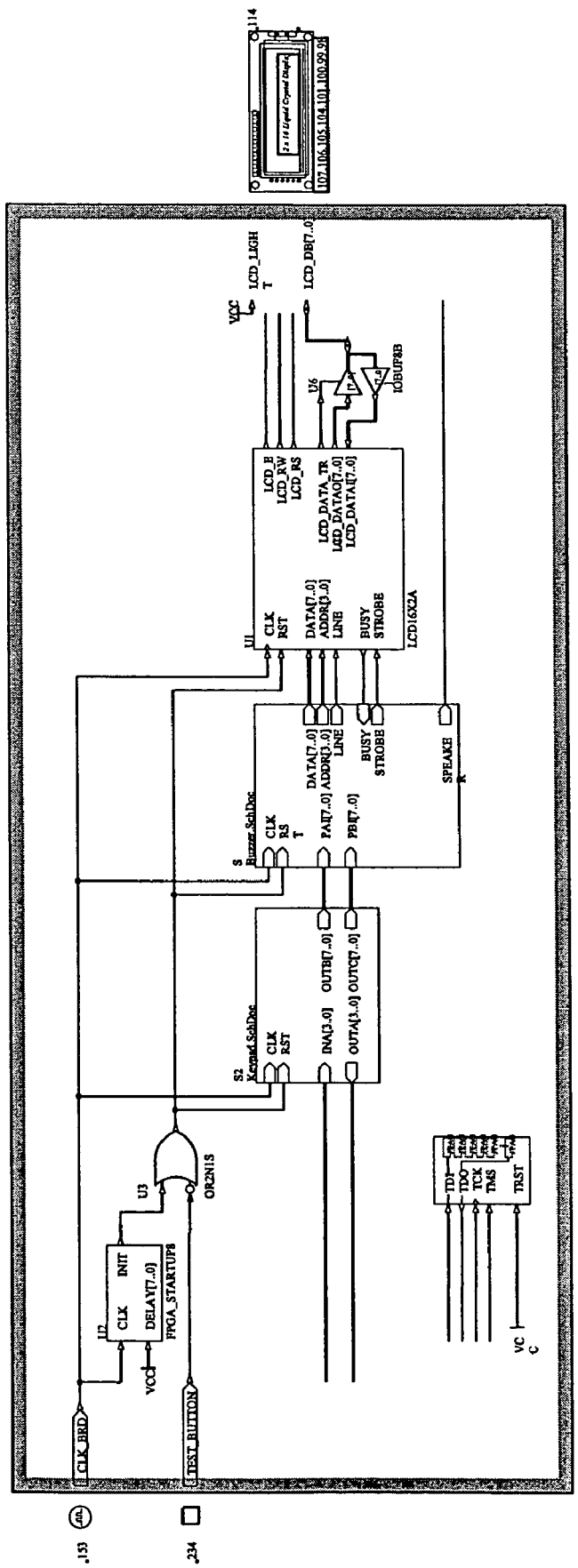
FIG. 4 illustrates designing with pre-synthesized symbolic components within a Schematic Editor included in the re-programmable digital platform design system in accordance with one embodiment of the present invention.

FIG. 4 illustrates designing with pre-synthesized symbolic components within a Schematic Editor. The top schematic sheet of an exemplary FPGA design that has been captured using the Schematic Editor is shown in FIG. 4. The exemplary hierarchical design, for example, a simple buzzer, utilizes a variety of symbolic components, including processor components, peripheral components, and generic logic components. Being able to place and wire FPGA-ready schematic components directly within a design capture environment already familiar to users enables them to build a more complex design simply and efficiently, without the common requirement for advanced HDL knowledge and expertise.

Figure 5:
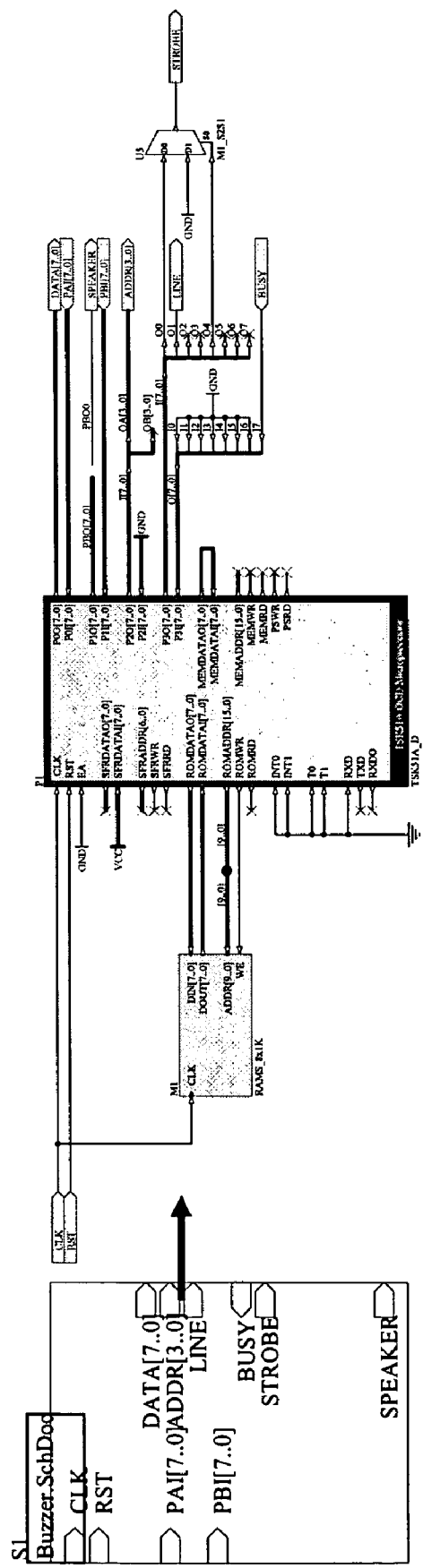
FIG. 5 is a diagram illustrating employing a pre-synthesized processor core component in an FPGA design using the re-programmable digital platform design system in accordance with one embodiment of the present invention.

FIG. 5 illustrates employing a pre-synthesized processor core component in an FPGA design. FIG. 5 shows the use of a schematic processor component within the same exemplary design shown in FIG. 4. The processor itself, for example, a member of the TSK51x family of microprocessors, is located on a sub-sheet within the design.

The re-programmable digital platform design system 10 and method employ a generic set of FPGA macro components comprising symbolic representations of blocks of functionality that a user may add to an FPGA. These schematic components are presented to the user as FPGA-ready schematic symbols that can be instantiated into a design. FPGA-ready schematic components are like traditional PCB-ready components, except instead of the symbol being linked to a PCB footprint, each is linked to a pre-synthesized EDIF model.

The pre-synthesized components are supplied as object code entities without having to expose the underlying RTL-level source code. The re-programmable digital platform design system 10 includes multiple libraries providing a comprehensive set of pre-synthesized components, ranging from simple gate-level functional blocks, up through high-level hardware, such as multipliers and pulse-width modulators, and high-level functions, such as microprocessors and communications functions.

These components can be instantiated into designs by the system user and then the whole design can be targeted to a suitable device. The re-programmable digital platform design system 10 and method automatically manage the resources required to instantiate the design in the chosen device, by ensuring that the EDIF models specific to that device are correctly chosen and linked to the generic symbols placed when capturing the design.

The re-programmable digital platform design system 10 and method preferably provide model linkage. As shown in FIG. 6, models are included for the generic, FPGA-ready, vendor-independent components and are stored in a hierarchy of folders, according to vendor and device family.

Figure 7:
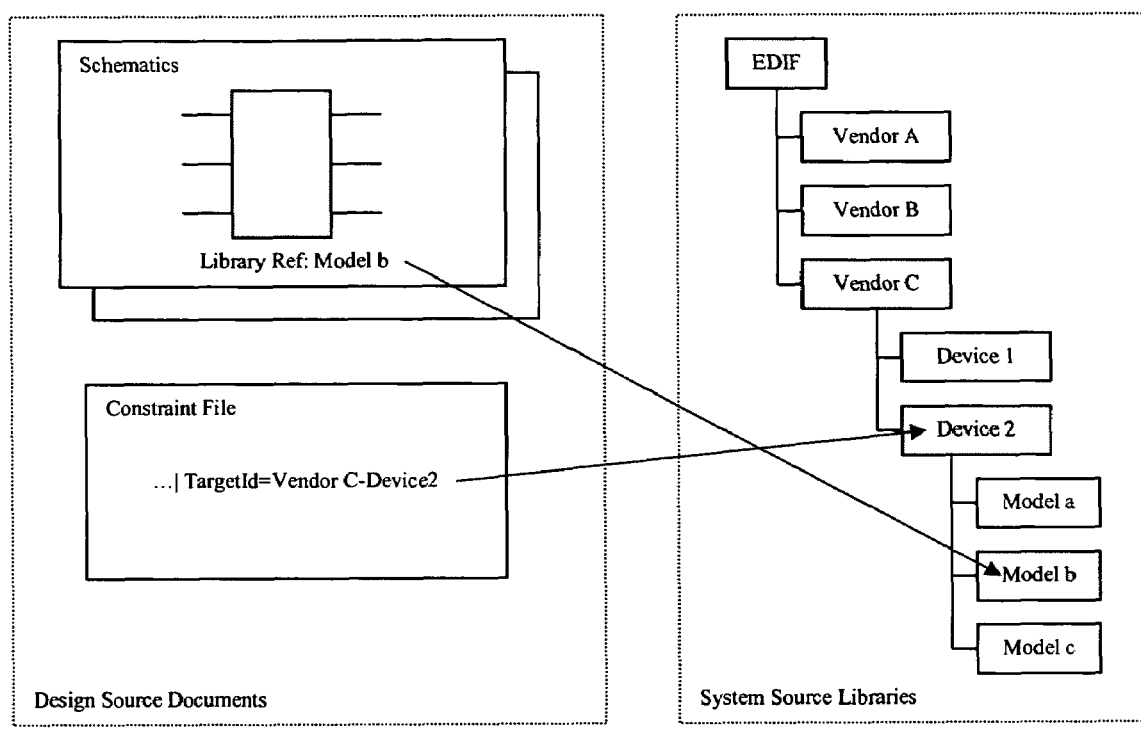
FIG. 7 is a diagram illustrating generic model linking in accordance with one embodiment of the re-programmable digital platform design system of the present invention.

The target FPGA device can be changed at any time during the design process, and the re-programmable digital platform design system 10 and method will re-link all of the generic component symbols to the relevant pre-synthesized EDIF models for that device, found within these folders. FIG. 7 illustrates the underlying mechanism for this linking, enabling vendor independency while enabling the user to design by placing generic schematic symbols.

Figure 9:
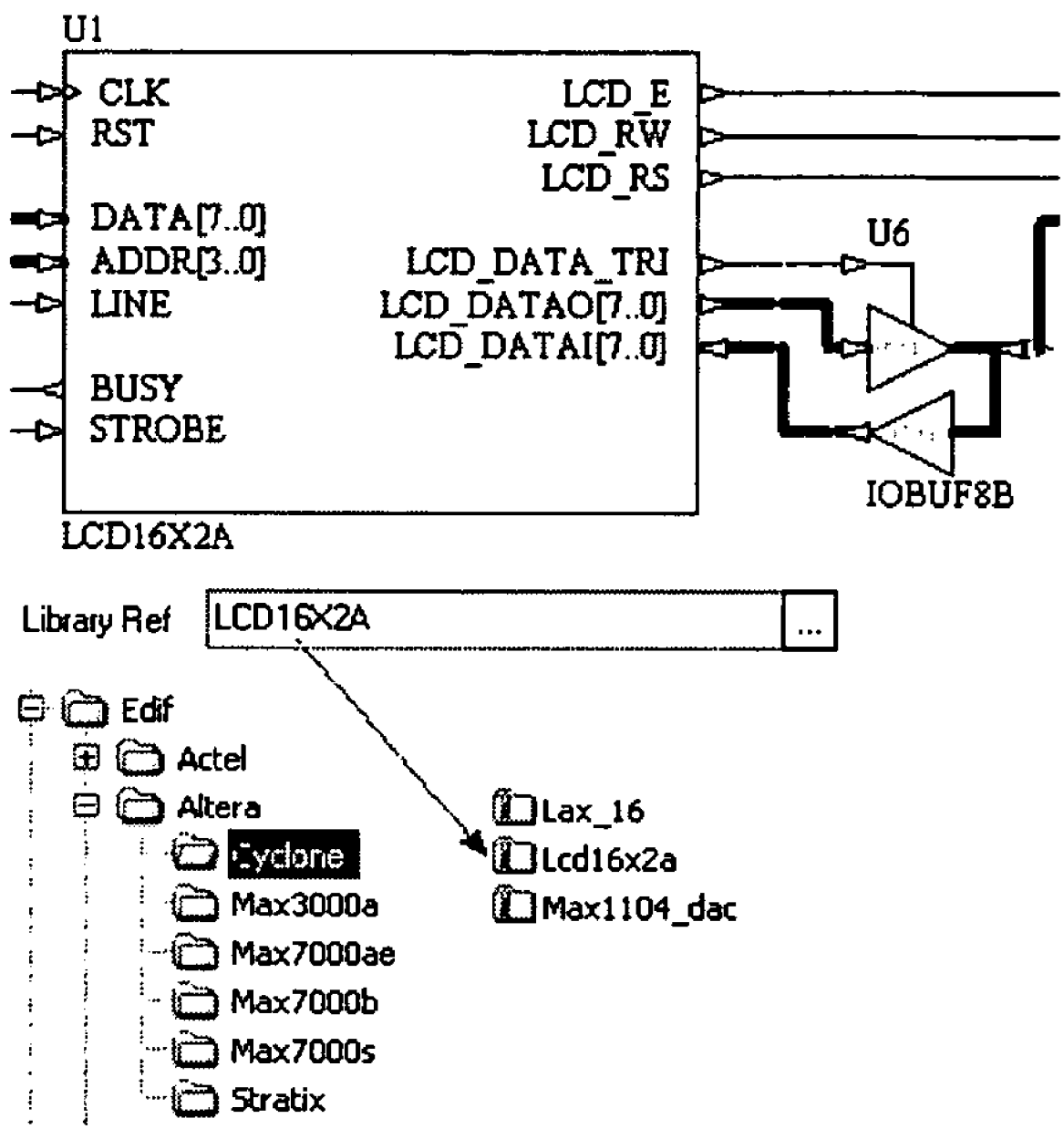
FIG. 9 illustrates locating the correct model to use for a specific target FPGA device using the re-programmable digital platform design system in accordance with one embodiment of the present invention.

The target device specified in the associated constraint file is used to select the correct folder of EDIF models, and then the component's Library Reference is used to select the EDIF model file from within that folder. For example, consider the LCD controller component in the simple buzzer design shown in FIG. 4, which in turn is targeted to an Altera Cyclone device using the relevant constraint file shown in FIG. 8. The re-programmable digital platform design system 10 and method automatically link the correct pre-synthesized model for that device to the generic symbol for the component placed on the schematic sheet. Because the target device is a Cyclone and belongs to the Altera stable of device families, the \Altera\Cyclone library sub-folder is searched for the model. FIG. 9 illustrates locating the correct model to use for a specific target FPGA device. The particular model to use is specified by the Library Reference for the component symbol, in this case an LCD16X2A, as shown in FIG. 9.

In addition to supplied models, user-created pre-synthesized EDIF models are supported. These can be stored in a single user model folder or in a hierarchy of folders if the user is developing a model for multiple target devices. The search sequence for EDIF models is:

$project_dir
$user_edif\$vendor\$family
$user_edif\$vendor
$user_edif
$system_edif\$vendor\$family
$system_edif\$vendor
$system_edif Pre-synthesized user models are developed by creating a Core project, whose EDIF output becomes the model for a user-defined component. There are a number of features to support this process, including commands to synthesize for all targets, publish the EDIF model (that is, package it with all other required EDIF models), and generate a component symbol to represent the core.

Figure 10:
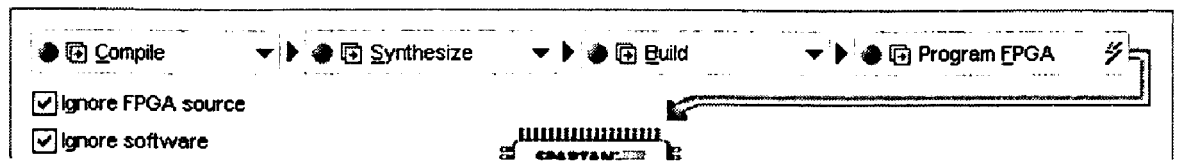
FIG. 10 illustrates a process flow when processing a captured FPGA design using the re-programmable digital platform design system in accordance with one embodiment of the present invention.

In accordance with one embodiment of the present invention, the re-programmable digital platform design system 10 and method automatically re-target a generic design for a selected re-programmable device. When processing a captured FPGA design, the stages involved are all carried out using a single Process Flow. Each physical device has an associated Process Flow, as shown in FIG. 10 The Process Flow consists of four distinct stages: 1) Compile, 2) Synthesize, 3) Build, and 4) Program FPGA.

Preferably, the re-programmable digital platform design system 10 and method include pre-processing preparation. In order to access the Process Flow for a physical device, a suitable project-configuration combination must be available. For a combination to be suitable, a configuration must have been defined for an FPGA project, and that configuration should contain a constraint file that targets the particular device.

Figure 11:
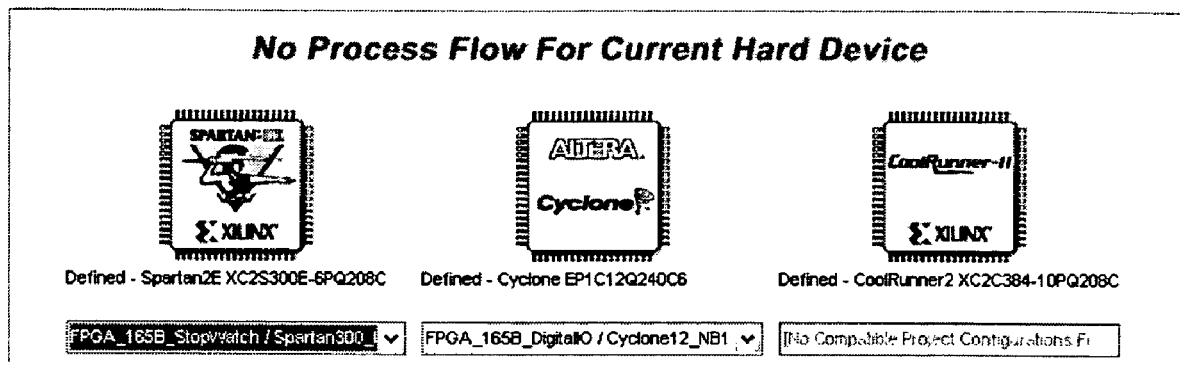
FIG. 11 illustrates that a suitable Project-Configuration combination is required to access the Process Flow when using the re-programmable digital platform design system in accordance with one embodiment of the present invention.

Suitable project-configuration combinations are automatically detected, where they exist, and are made available in a drop-down menu below the device. FIG. 11 illustrates a case in which a device in the view does not have a suitable project-configuration combination, and, hence, the Process Flow is not available.

Figure 13:
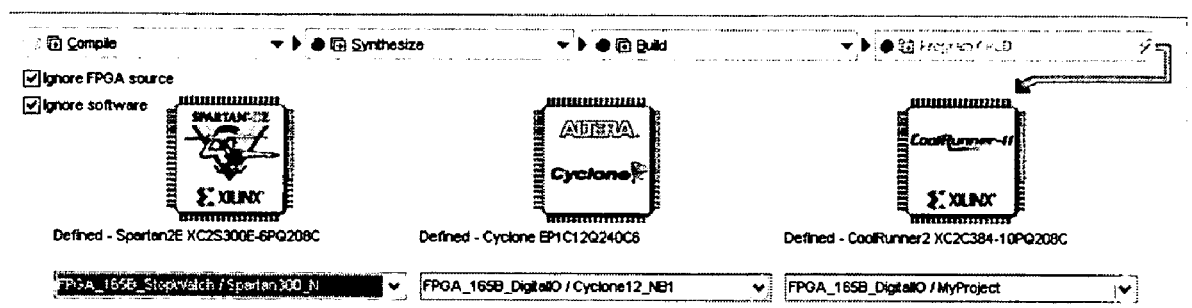
FIG. 13 illustrates detecting the required Project-Configuration combination giving access to the Process Flow for the device when using the re-programmable digital platform design system in accordance with one embodiment of the present invention.

In this case, a constraint file targeting the CoolRunner device would have to be created and then assigned to a configuration using a Configuration Manager included in the re-programmable digital platform design system 10, as shown in FIG. 12. The suitable project-configuration combination will then be automatically detected, giving access to the Process Flow for the device, as shown in FIG. 13.

The re-programmable digital platform design system 10 and method provide mapping of a synthesized design. With respect to a design that has been synthesized, each device vendor provides a set of tools that can be used to map a synthesized design into the hardware resources inside a given target device. These tools are quite different from one vendor to another, but provide the same functionality.

The re-programmable digital platform design system 10 and method wrap transparently around each different tool chain and provide a generic view of the Process Flow to the user. This enables users to only have to learn one process flow in order to use multiple different vendors' tool chains and allows easy movement between different devices from different vendors to easily port their designs to new target devices.

Figure 14:
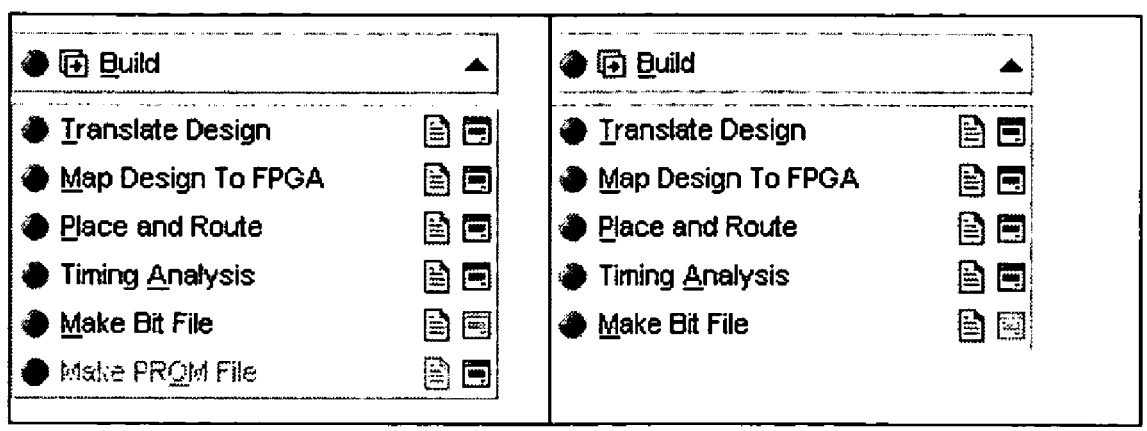
FIG. 14 illustrates a Build stage of the Process Flow for Xilinx (left) and Altera (right) devices using the re-programmable digital platform design system in accordance with one embodiment of the present invention.

This flow is accessed from the Build stage of the overall Process Flow, as shown for Xilinx and Altera devices in FIG. 14. The Build stage of the Process Flow is used to run the vendor place and route tools. Running the tools at this stage can verify whether or not a design will indeed fit inside the selected device. The user may also elect to run the vendor tools if he or she wants to obtain pin assignments for importing back into the relevant constraint file.

The end result of running the Build stage is the generation of an FPGA programming file that is ultimately used to program the target device with the design. There are preferably five main stages to the Build process:

Translate Design—uses the top-level EDIF netlist and synthesized model files, obtained from the synthesis stage of the Process Flow, to create a file in Native Generic Database (NGD) format in the case of Xilinx target devices Map Design To FPGA—maps the design to FPGA primitives Place and Route—takes the low-level description of the design from the mapping stage and determines how to place the required logic inside the FPGA, and, once arranged, the required interconnections are routed Timing Analysis—performs a timing analysis of the design, in accordance with any timing constraints that have been defined, and, if there are no specified constraints, default enumeration is used Make Bit File—generates a programming file that is required for downloading the design to the target device.

When targeting a Xilinx device, an additional stage is available, namely, Make PROM File. This stage is used when the user wants to generate a configuration file for subsequent download to a Xilinx configuration device on a production board.

After the Build stage has completed, the Results Summary dialog appears, as shown in FIG. 15. This dialog provides summary information with respect to resource usage within the target device.

Additionally, the re-programmable digital platform design system 10 and method in accordance with one embodiment of the present invention automatically manage device-specific design constraints. The design captured in the schematics and RTL-level HDL defines the behavior of the circuit. To map this design into an FPGA that is part of a larger PCB design requires the addition of all the necessary implementation information. This information may include:

the target PCB project;
the target FPGA;
FPGA net-to-physical device pin assignments;
pin configuration information, such as output voltage settings;
design timing constraints, such as allocating a specific net to a special function FPGA pin; and
FPGA place and route constraints.

The re-programmable digital platform design system 10 and method provide a generic constraint model in which this information can be specified. By storing the implementation data separate from the source design documents, the same design can be easily re-targeted to a different physical FPGA device, allowing true design portability.

The implementation information is stored in constraint files. A constraint file is a set of constraint records, in which each record or constraint group defines one or more constraints to be applied to a particular object in the FPGA project. The FPGA-specific constraint definitions used in a constraint file are those recognized by vendor tools, enabling transparent mapping of constraint file information to the vendor-specific constraint system for implementation.

FPGA designs are captured in the DXP-based design environment as schematics and RTL-level HDL files. Implementation information, such as device pin allocations and pin electrical properties, are not stored in these source files; they are stored in separate constraint files.

Constraints can be divided over a number of constraint files, and a project can include a number of different constraint files that are used to target the design to different implementations. To allow a user to group constraint files and to move easily from one implementation to another, the user defines configurations. A configuration is simply a named collection of constraint files.

Constraints are normally defined in constraint files using a constraint editor. To add a new constraint file to a project, a user can right-click on the project name, then from an Add New to Project submenu select Constraint File. Constraints can be defined by typing them in, or by adding them using menu options available in a constraint file editor Design menu.

Constraint files are mapped to an FPGA design by defining a Configuration. The user can do so by right-clicking on the project file name in the panel and selecting Configuration Manager. Multiple constraint files can be enabled in a configuration, enabling the user to separate constraints by their type. For example, a user can add design-specific constraints, such as specifying a net to be a clock, in one constraint file, and implementation type constraints, such as pin allocations, in a second constraint file. When an FPGA design is implemented in a device, the user selects a project/configuration combination, allowing the design to be mapped to its implementation. By defining multiple configurations, the user can easily re-target a design from one device to another.

Typically, constraint information is divided across multiple constraint files in accordance with the particular class of constraint being defined. For example, the classes may include:
  Constraints specific to the device and board—concerning connection of the FPGA device to the outside world;
  Constraints specific to a certain device—concerning specifications for how to use internal features of the particular device. A good example would be place and route controls for FPGA tools which are very device-specific, but do not have any impact on the way the device is connected to the outside world; and
  Constraints specific to a project or design—concerning requirements which are associated with the logic of the design, as well as constraints on its timing.

Figure 16:
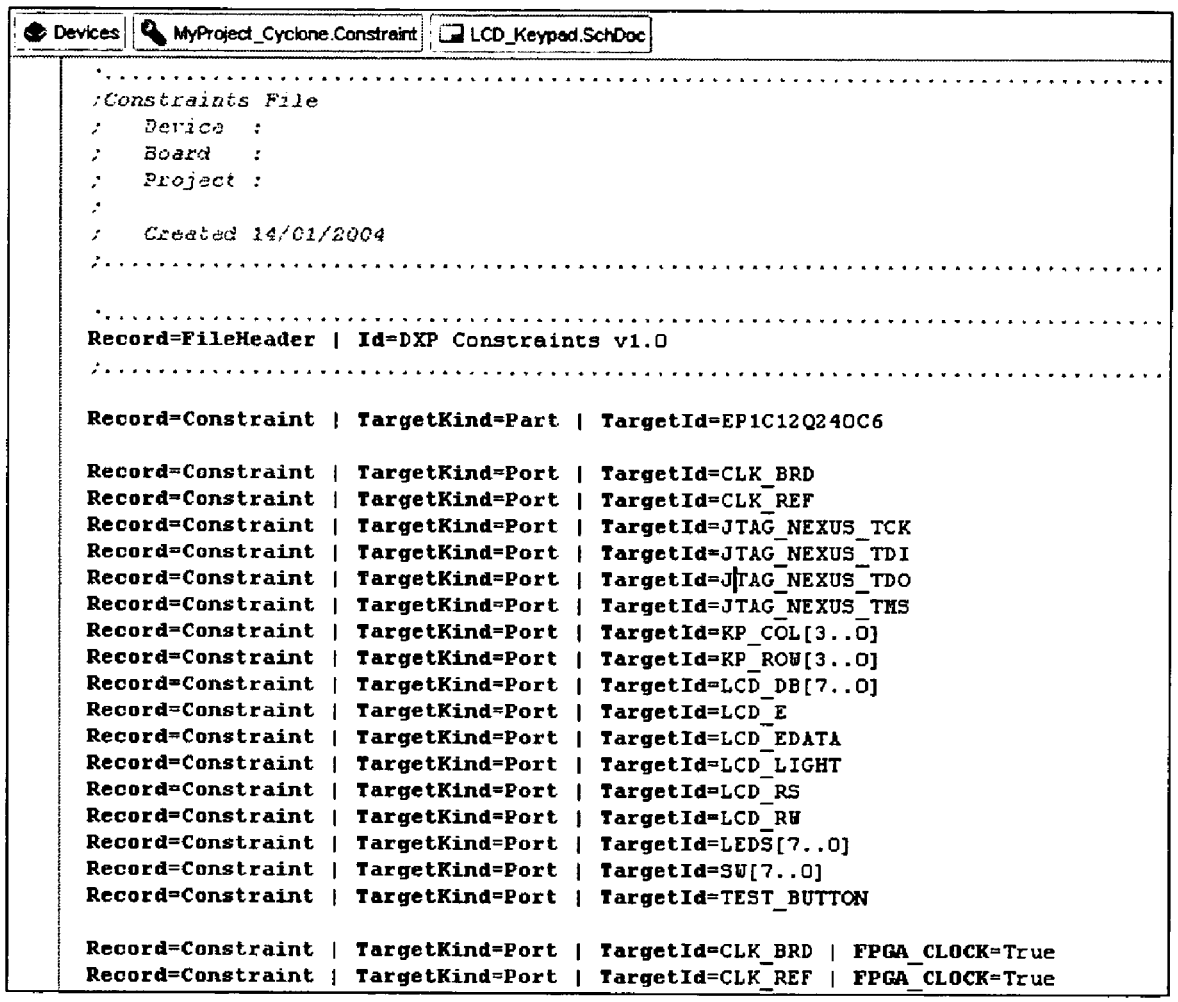
FIG. 16 illustrates an exemplary constraint file using the re-programmable digital platform design system in accordance with one embodiment of the present invention.

To ensure the most portable FPGA design, the most logical approach is to break the constraints into these three classes and store these in separate constraint files, as shown in FIG. 16. FIG. 14 illustrates an exemplary constraint file, with two clock nets constrained by the FPGA_CLOCK=TRUE constraint. Note that the pin allocations have not yet been defined.

Preferably, constraint definitions include: 1) Record to define the purpose of entry in a constraint file; 2) TargetKind to define what a record in the constraint file applies to; 3) TargetId to provide the name of the object being targeted by the constraint record; and 4) Id, which is a FileHeader constraint to specify the type and version of constraint file.

FPGA-specific constraints are used in conjunction with the device vendor's component specifications to ensure that a particular constraint is supported in that device. These include the following FPGA-specific constraints:

FPGA_CLOCK states that the top level port of the target technology should use a high speed resource.

FPGA_CLOCK_DUTY_CYCLE sets the duty cycle of the clock.

FPGA_CLOCK_FREQUENCY sets the desired frequency of the clock, and the place and route tool will attempt to achieve this frequency.

FPGA_CLOCK_PIN states that the top level port is connected to a reserved clock pin on the target device.

FPGA_DEVICE specifies the target device.

FPGA_DRIVE specifies the current strength of a pin in the target device and may be applied to ports in the top-level entity.

FPGA_GLOBAL states that the signal should be kept, and use a high speed resource.

FPGA_INHIBIT_BUFFER states that no input/output (I/O) buffers are inserted at the pin.

FPGA_IOSTANDARD specifies the pin I/O standard in the target device, and may be applied to ports in the top-level entity.

FPGA_KEEP prevents a particular signal from being optimized.

FPGA_NOCLOCK prevents the synthesizer from placing a clock buffer. The synthesizer has the ability to infer clock buffers and add them automatically.

FPGA_PCI_CLAMP enables Peripheral Component Interconnect (PCI) compatibility for a pin.

FPGA_PINNUM specifies the pin-out in the target device, and may be applied to ports in the top-level entity.

FPGA_PULLDOWN adds a pulldown resistor to an I/O port.

FPGA_PULLUP adds a pullup resistor to an I/O port.

FPGA_RESERVE_PIN ensures that the place and route tools do not assign this particular pin to a port of the design.

FPGA_SLEW specifies the slew standard in the target device, and may be applied to ports in the top-level entity.

The user can also invoke the options in the Design>>Import Pin File menu in the constraint file editor to import constraints defined by the place and route software.

Figure 17:
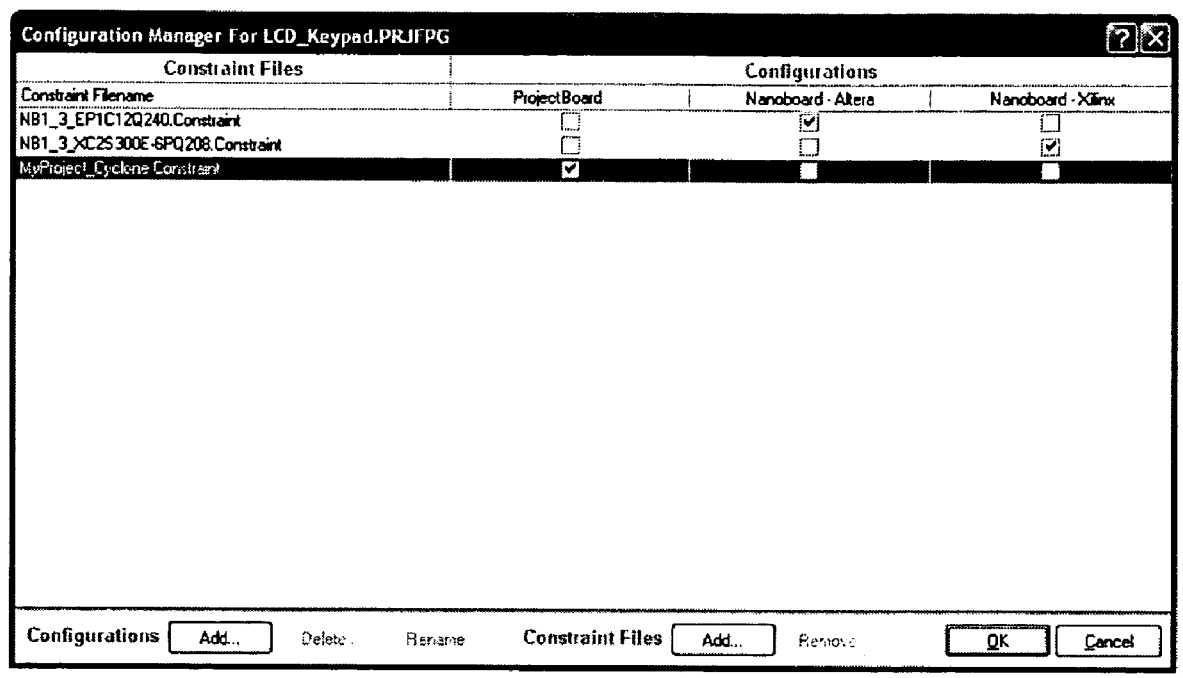
FIG. 17 illustrates a Configuration Manager using the re-programmable digital platform design system in accordance with one embodiment of the present invention.

The re-programmable digital platform design system 10 includes a Configuration Manager, allowing the user to determine which constraint files are to be associated with a particular target FPGA device, as shown in FIG. 17. FIG. 15 illustrates a Configuration Manager showing three configurations, each with one constraint file assigned.

For example, consider an FPGA project that is targeted to:
  a Xilinx Spartan-XC2S300E QFP208 on a NanoBoard,
  an Altera Cyclone QFP240 on a NanoBoard, and
  a Xilinx Spartan-XC2S100E QFP144 on the user's own board design.

This project requires three configurations, one for each target device. Assuming good design practice from a portability perspective, this would theoretically require seven constraint files, separate constraint files to control the pin-outs for each of the three devices in their target boards, separate constraint files to control any internal place and route constraints for each of the three target devices, and one constraint file for logical design constraints. If there were no place and route constraints, then there are only four constraint files. Each configuration would then include three constraint files, two which are specific to the configuration and one which is common to all configurations.

If there were constraints that were common to the two different Xilinx devices, which are internally very similar, then it may be beneficial to create a constraint file for these. In this case, the extra constraint file would be added to two of the configurations.

Figure 18:
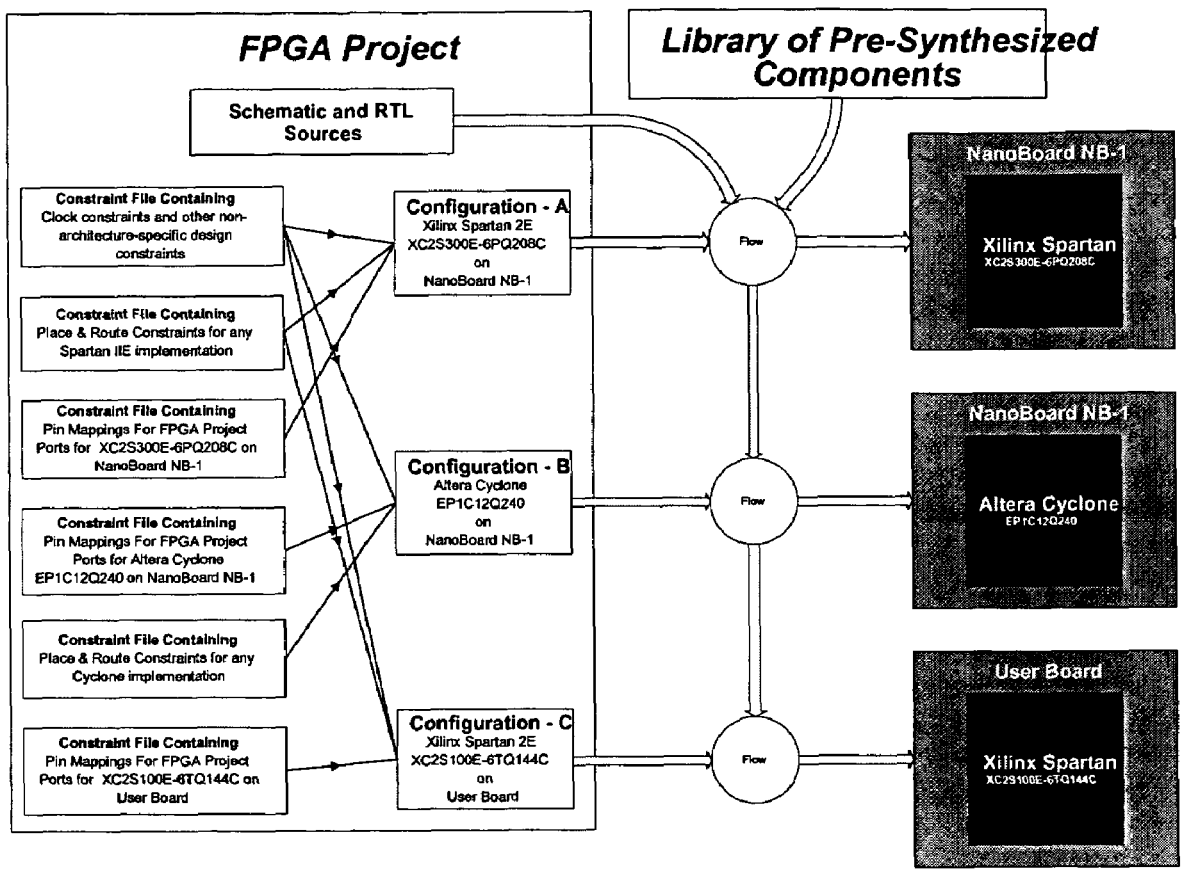
FIG. 18 illustrates diagrams of three configurations and their constraint files using the re-programmable digital platform design system in accordance with one embodiment of the present invention.
Figure 19:
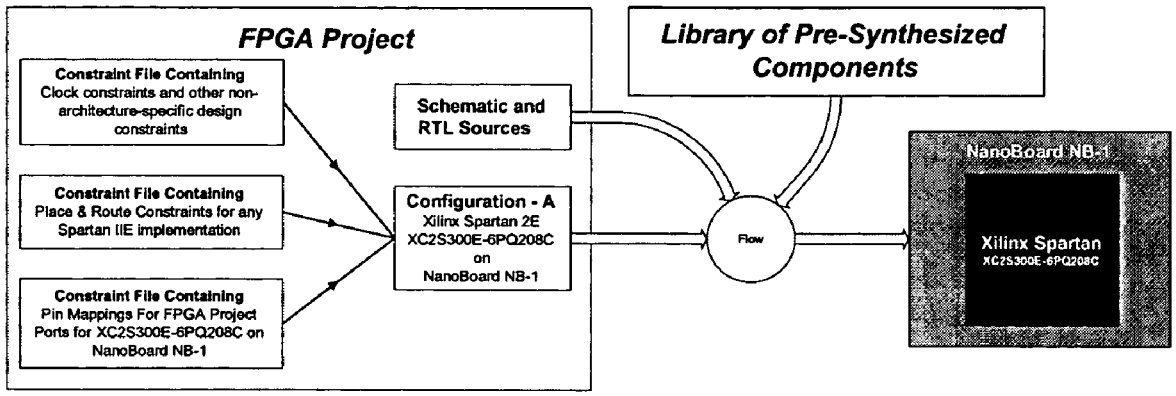
FIG. 19 illustrates a design targeting a Xilinx Spartan2e 300 device on a NanoBoard using the re-programmable digital platform design system in accordance with one embodiment of the present invention.
Figure 20:
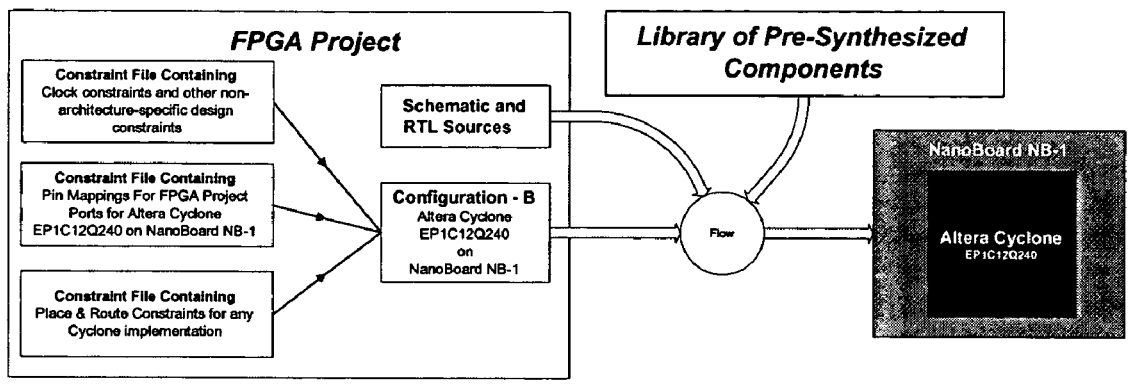
FIG. 20 illustrates a design targeting an Altera Cyclone EPC12 device on a NanoBoard using the re-programmable digital platform design system in accordance with one embodiment of the present invention.
Figure 21:
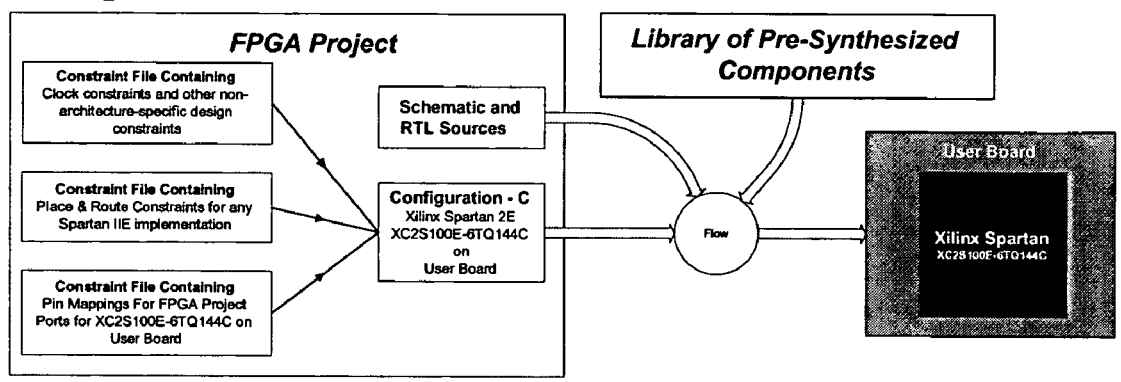
FIG. 21 illustrates a design targeting a Xilinx Spartan2 100 device on a User Board using the re-programmable digital platform design system in accordance with one embodiment of the present invention.

Diagrams of these three configurations and their constraint files are illustrated in FIG. 18. FIG. 18 shows the relationships between the constraint files and the configurations. As shown in FIG. 18, a single set of schematic and RTL-level HDL source documents is targeted to three different implementations by different sets of constraint files. The actual setups for each of the three configurations are shown in FIGS. 19-21.

Each line in a constraint file is referred to as a constraint group, since it applies one or more constraint requirements to an entity in the design. The following examples show a variety of different constraint groups.

EXAMPLE 1

Record=Constraint|TargetKind=Part|TargetId=XC2S300E-6PQ208C

This constraint targets the part (or FPGA component), in this case specifying the type as XC2S300E-6PQ208C. Note that this device must be supported by selecting the Design>>Add/Modify Constraint>>Part menu item to display the Choose Physical Device dialog. This dialog displays all devices supported by the re-programmable digital platform design system 10. This constraint group should only appear once in any configuration.

EXAMPLE 2

Record=Constraint|TargetKind=Port|TargetId=VGA_VSYN|FPGA_PINNUM=P134

This constraint group targets the net connected to port VGA_VSYN, specifying that it is connected to FPGA pin number P134.

EXAMPLE 3

Record=Constraint|TargetKind=Port|TargetId=LCD_E|FPGA_PINNUM=P82|FPGA_IOSTANDARD=LVTTL33|FPGA_SLEW=SLOW|FPGA_DRIVE=12 mA This constraint group targets the net connected to the port LCD_E, specifying that it is connected to FPGA pin number P82, have an I/O standard of LVTTL33, a slew setting of slow, and a drive current of 12 mA.

EXAMPLE 4

Record=Constraint|TargetKind=Port|TargetId=VGA_R[1 . . . 0]|FPGA_PINNUM=P145, P141

This constraint group targets both the nets in the bus connected to the port VGA_R[1 . . . 0], specifying that the bus element 1 connect to pin P145, and bus element 0 connect to pin P141.

The re-programmable digital platform design system 10 and method in accordance with one embodiment of the present invention also preferably provide a development platform for interactive, re-targetable hardware/software co-design of programmable device hosted systems. This development platform, referred to as a NanoBoard, allows a single development platform to provide development resources for an unlimited number of target devices, such as FPGAs, CPLDs, or embedded microprocessors, from one or more different semiconductor manufacturers. The Nano-Board contains a controller that manages communications with the host-based development software, the daisy-chaining of multiple NanoBoards, connections to user-designed boards, and interfaces to physical resources on the Nano-Board.

Figure 22:
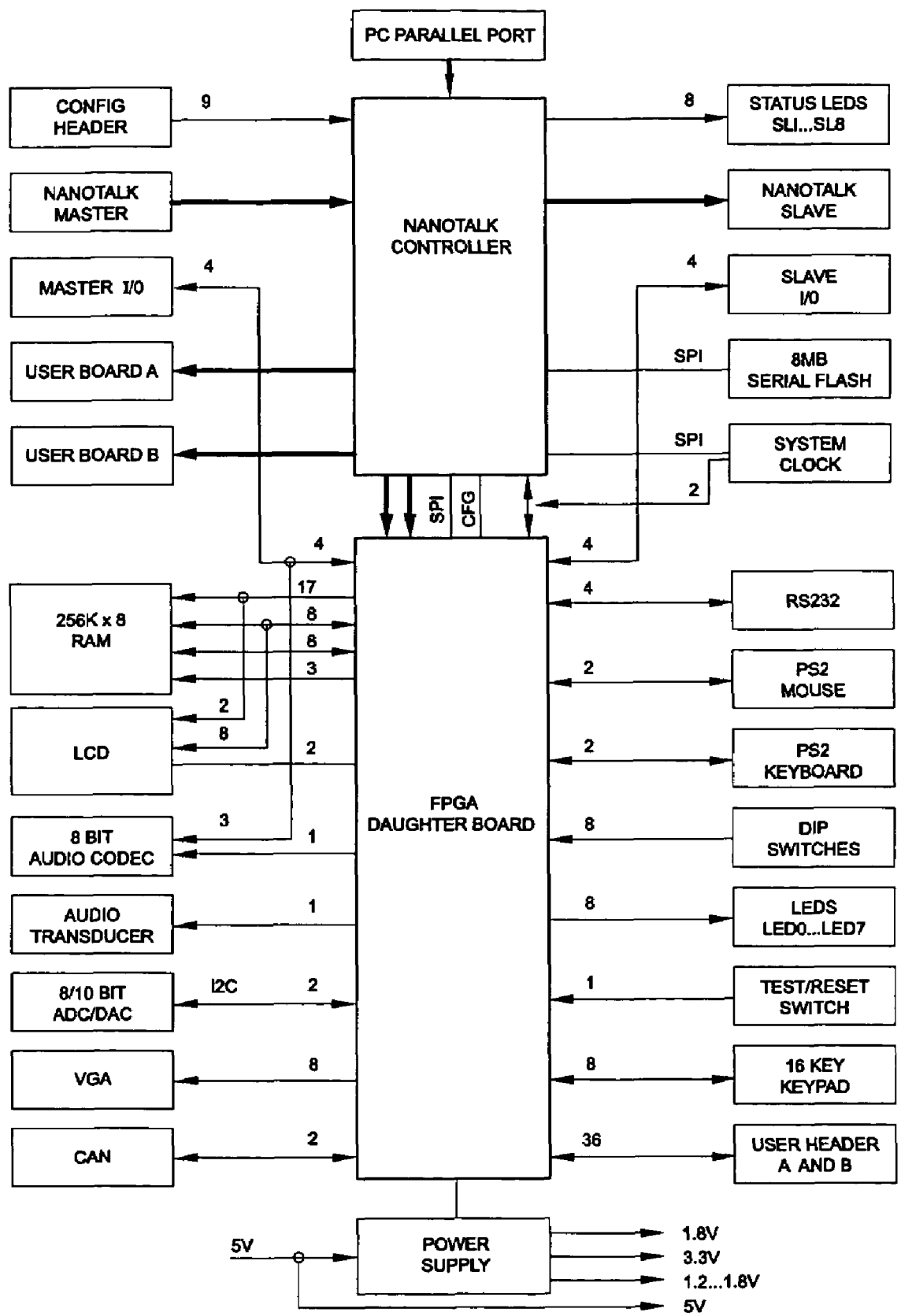
FIG. 22 is a block diagram of a NanoBoard configuration preferably included in the re-programmable digital platform design system in accordance with one embodiment of the present invention.

The NanoBoard controller employs a "NanoTalk" protocol to communicate with the PC-based software and to communicate with other NanoBoards in the daisy-chain. Each NanoBoard also contains a "standard" socket for installing various daughter boards, each of which houses a physical device that is to be used for development. These daughter boards generate an identification code that is read by the controller, which can then program the device at power-up. FIG. 22 is a block diagram of a NanoBoard, showing the interface between the on-board controller (NanoTalk controller) and both the host PC 12 and the daughter board plug-in.

The re-programmable digital platform design system 10 and method in accordance with one embodiment of the present invention further preferably provide an interactive design environment that automates support for multiple development boards. Each NanoBoard has a master and slave connector, allowing an unlimited number of Nano-Boards to be daisy-chained together. When another board is plugged into the chain, it is automatically recognized, and all of its resources become available to the re-programmable digital platform design system 10.

The chain of development boards may consist of multiple NanoBoards, as well as user or third party development boards, attached to the chain through the use of dedicated user board headers, located on each NanoBoard. The re-programmable digital platform design system 10 employs a single pin on a header (either the NanoTalk Master or NanoTalk Slave headers when chaining additional Nano-Boards, or User Board A/User Board B headers when attaching user boards) to detect and allow another board with JTAG devices to be automatically brought into the main JTAG chain.

Figure 23:
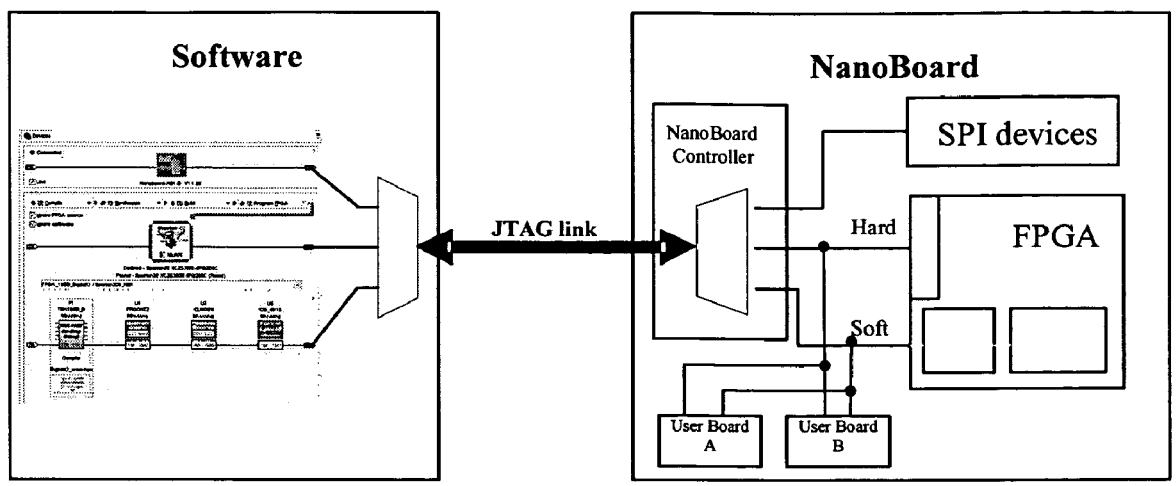
FIG. 23 illustrates accessing information for multiplexed JTAG chains over a single JTAG link when using the re-programmable digital platform design system in accordance with one embodiment of the present invention.

Detection and resource management is controlled by the NanoBoard controller on the Master board which, upon detecting the presence of a new Slave board brings all of the hard devices for that board into the main Hard JTAG chain and all of the soft devices into the main Soft JTAG chain. A protocol for multiplexed JTAG/SPI channels is used, in which a single JTAG interface between the PC 12 and the development platform controls multiple JTAG and SPI chains, as shown in FIG. 23.

Figure 24:
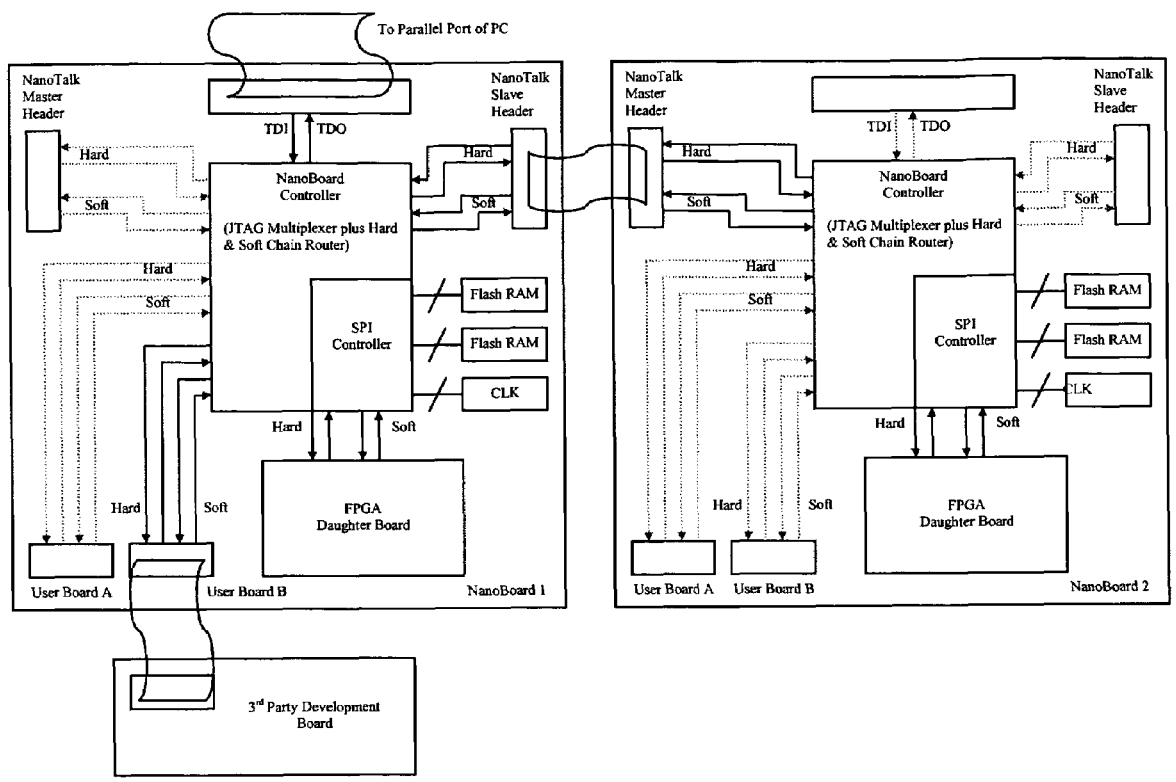
FIG. 24 is a block diagram of daisy-chaining multiple development boards preferably included in the re-programmable digital platform design system in accordance with one embodiment of the present invention.

FIG. 24 illustrates two NanoBoards daisy-chained together, with a third party development board attached to the first NanoBoard in the chain. In FIG. 24, only TDI and TDO JTAG signals have been shown for simplicity. Multiplexing of JTAG and SPI chains into a single JTAG link between the PC 12 and the first NanoBoard in the daisy-chain is handled by the NanoBoard controller of that first board.

All routing of the main Hard and Soft JTAG chains is carried out within the NanoBoard controller, with each chain routed in accordance with detected boards, such as additional NanoBoards, user or third party boards, and daughter boards. The NanoBoard controller on each board can be accessed from the PC 12 to control the individual resources located on each board.

The re-programmable digital platform design system 10 and method in accordance with one embodiment of the present invention also preferably provide a generic boot system capable of supporting multiple programmable device architectures. The re-programmable digital platform design system 10 incorporates a generic boot system providing support to program, at power-up, a multitude of different target devices. This bootstrapping functionality is facilitated using the NanoBoard controller and a generic low-cost serial flash random access memory (RAM) device.

Figure 25:
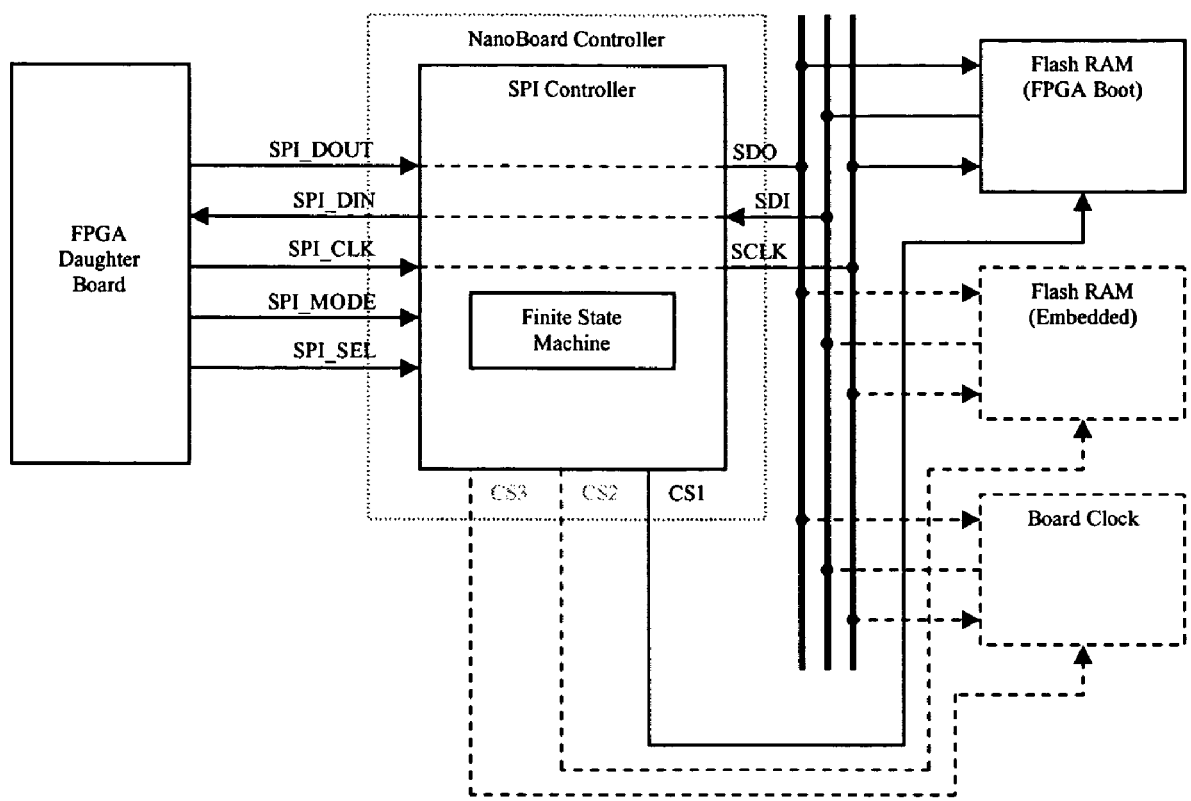
FIG. 25 is a block diagram showing FPGA Daughter-Board-to-Flash-RAM communications preferably included in the re-programmable digital platform design system in accordance with one embodiment of the present invention.

The flash RAM is an SPI-compatible device. Access to this RAM by the physical device on the daughter board is made through the SPI controller, which resides within the NanoBoard controller on the NanoBoard, as shown in FIG. 25.

The SPI controller serves the role of SPI Bus Master, determining what accesses the SPI Bus (NanoBoard controller, daughter board, or host computer (via the parallel port)) and which of the SPI slave devices (embedded flash RAM, FPGA boot flash RAM, or NanoBoard system clock) is selected for communications. Preferably, the re-programmable digital platform design system 10 in accordance with one embodiment of the present invention comprises a programmable clock generator to facilitate the live testing of a design in the target device at different operating frequencies by allowing the host PC 12 to dynamically select a clock frequency from a range of allowable frequencies. Thus, the host PC 12 may be employed to vary the FPGA clock frequency.

The daughter boards generate an identification code which is used by the NanoBoard controller to identify the device. At power-up, the following occurs:
  the NanoBoard controller identifies the physical device on the currently plugged-in daughter board
  the SPI controller is configured for communications between the daughter board and the flash RAM device
  the data stream is read from the flash RAM, and the physical device on the daughter board is subsequently programmed using the programming algorithm that is appropriate for that target device.

To assist with interchanging FPGA daughter boards with different power rail requirements, the re-programmable digital platform design system 10 in accordance with one embodiment of the present invention preferably comprises a programmable voltage regulator. The target voltage is determined by a divider network located on the daughter board and connected to the NanoBoard of the re-programmable digital platform design system 10 via a designated pin. This configuration enables the size and cost of the daughter boards to be reduced while increasing performance.

The following is an example of textual source code produced by one embodiment of the design system and method for re-programmable digital platforms in accordance with the present invention:

```
(EDIF FPGA_51_C_165B_ASM_Buzzer
 (EDIFVersion 2 0 0)
 (EDIFLevel 0)
 (keywordMap (keywordLevel 0))
 (status(Written
    (TimeStamp 2004 7 5 12 32 56)
```

```
    (Program "DXP" (version "3.7.0.86"))
    (Comment "Copyright (c) 2002-2003 Altium Limited")))
(library Xilinx (EDIFLevel 0) (technology (numberdefinition))
  (cell GND (celltype GENERIC) (view view_1 (viewType NETLIST)
    (interface
      (port G (direction OUTPUT)))))
  (cell OBUFT (celltype GENERIC) (view view_1 (viewType NETLIST)
    (interface
      (port O (direction OUTPUT))
      (port I (direction INPUT))
      (port T (direction INPUT)))))
  (cell BUFG (celltype GENERIC) (view view_1 (viewType NETLIST)
    (interface
      (port O (direction OUTPUT))
      (port I (direction INPUT)))))
  (cell OBUF (celltype GENERIC) (view view_1 (viewType NETLIST)
    (interface
      (port O (direction OUTPUT))
      (port I (direction INPUT)))))
  (cell IBUF (celltype GENERIC) (view view_1 (viewType NETLIST)
    (interface
      (port O (direction OUTPUT))
      (port I (direction INPUT)))))
  (cell VCC (celltype GENERIC) (view view_1 (viewType NETLIST)
    (interface
      (port P (direction OUTPUT)))))
  (cell IBUFG (celltype GENERIC) (view view_1 (viewType NETLIST)
    (interface
      (port O (direction OUTPUT))
      (port I (direction INPUT)))))
  (cell LCD16X2A (celltype GENERIC) (view view_1 (viewType NETLIST)
    (interface
      (port (array (rename ADDR "ADDR(3:0)") 4) (direction INPUT))
      (port BUSY (direction OUTPUT))
      (port CLK (direction INPUT))
      (port (array (rename DATA "DATA(7:0)") 8) (direction INPUT))
      (port LCD_DATA_TRI (direction OUTPUT))
      (port (array (rename LCD_DATAI "LCD_DATAI(7:0)") 8) (direction INPUT))
      (port (array (rename LCD_DATAO "LCD_DATAO(7:0)") 8) (direction OUTPUT))
      (port LCD_E (direction OUTPUT))
      (port LCD_RS (direction OUTPUT))
      (port LCD_RW (direction OUTPUT))
      (port LINE (direction INPUT))
      (port RST (direction INPUT))
      (port STROBE (direction INPUT)))))
  (cell FPGA_STARTUP8 (celltype GENERIC) (view view_1 (viewType NETLIST)
    (interface
      (port CLK (direction INPUT))
      (port (array (rename DELAY "DELAY(7:0)") 8) (direction INPUT))
      (port INIT (direction OUTPUT)))))
  (cell OR2N1S (celltype GENERIC) (view view_1 (viewType NETLIST)
    (interface
      (port I0 (direction INPUT))
      (port I1 (direction INPUT))
```

```
      (port O (direction OUTPUT)))))
    (cell M1_S2S1 (celltype GENERIC) (view view_1 (viewType NETLIST)
      (interface
        (port D0 (direction INPUT))
        (port D1 (direction INPUT))
        (port O (direction OUTPUT))
        (port S0 (direction INPUT)))))
    (cell J8S_8B (celltype GENERIC) (view view_1 (viewType NETLIST)
      (interface
        (port I0 (direction INPUT))
        (port I1 (direction INPUT))
        (port I2 (direction INPUT))
        (port I3 (direction INPUT))
        (port I4 (direction INPUT))
        (port I5 (direction INPUT))
        (port I6 (direction INPUT))
        (port I7 (direction INPUT))
        (port (array (rename O "O(7:0)") 8) (direction OUTPUT)))))
    (cell J8B_8S (celltype GENERIC) (view view_1 (viewType NETLIST)
      (interface
        (port (array (rename I "I(7:0)") 8) (direction INPUT))
        (port O0 (direction OUTPUT))
        (port O1 (direction OUTPUT))
        (port O2 (direction OUTPUT))
        (port O3 (direction OUTPUT))
        (port O4 (direction OUTPUT))
        (port O5 (direction OUTPUT))
        (port O6 (direction OUTPUT))
        (port O7 (direction OUTPUT)))))
    (cell Memory_M1 (celltype GENERIC) (view view_1 (viewType NETLIST)
      (interface
        (port (array (rename ADDR "ADDR(9:0)") 10) (direction INPUT))
        (port CLK (direction INPUT))
        (port (array (rename DIN "DIN(7:0)") 8) (direction INPUT))
        (port (array (rename DOUT "DOUT(7:0)") 8) (direction OUTPUT))
        (port WE (direction INPUT)))))
    (cell TSK165B_D (celltype GENERIC) (view view_1 (viewType NETLIST)
      (interface
        (port CLK (direction INPUT))
        (port POWERUP (direction INPUT))
        (port (array (rename RAI "RAI(7:0)") 8) (direction INPUT))
        (port (array (rename RAO "RAO(7:0)") 8) (direction OUTPUT))
        (port (array (rename RBI "RBI(7:0)") 8) (direction INPUT))
        (port (array (rename RBO "RBO(7:0)") 8) (direction OUTPUT))
        (port (array (rename RCI "RCI(7:0)") 8) (direction INPUT))
        (port (array (rename RCO "RCO(7:0)") 8) (direction OUTPUT))
        (port (array (rename ROMADDR "ROMADDR(10:0)") 11) (direction OUTPUT))
        (port (array (rename ROMDATAI "ROMDATAI(11:0)") 12) (direction INPUT))
        (port (array (rename ROMDATAO "ROMDATAO(11:0)") 12) (direction OUTPUT))
        (port ROMWE (direction OUTPUT))
        (port RST (direction INPUT))
        (port TCK (direction INPUT))
        (port TDI (direction INPUT))
        (port TDO (direction OUTPUT))
```

```
      (port TMS (direction INPUT))
      (port (array (rename TRISA "TRISA(7:0)") 8) (direction OUTPUT))
      (port (array (rename TRISB "TRISB(7:0)") 8) (direction OUTPUT))
      (port (array (rename TRISC "TRISC(7:0)") 8) (direction OUTPUT))
      (port TRST (direction INPUT))
      (port WDTC (direction OUTPUT))
      (port WDTO (direction INPUT)))))
  (cell J8B_4B2 (celltype GENERIC) (view view_1 (viewType NETLIST)
    (interface
      (port (array (rename I "I(7:0)") 8) (direction INPUT))
      (port (array (rename OA "OA(3:0)") 4) (direction OUTPUT))
      (port (array (rename OB "OB(3:0)") 4) (direction OUTPUT)))))
  (cell Memory_M2 (celltype GENERIC) (view view_1 (viewType NETLIST)
    (interface
      (port (array (rename ADDR "ADDR(8:0)") 9) (direction INPUT))
      (port CLK (direction INPUT))
      (port (array (rename DIN "DIN(11:0)") 12) (direction INPUT))
      (port (array (rename DOUT "DOUT(11:0)") 12) (direction OUTPUT))
      (port WE (direction INPUT)))))
  (cell TSK51A_D (celltype GENERIC) (view view_1 (viewType NETLIST)
    (interface
      (port CLK (direction INPUT))
      (port EA (direction INPUT))
      (port INT0 (direction INPUT))
      (port INT1 (direction INPUT))
      (port (array (rename MEMADDR "MEMADDR(15:0)") 16) (direction OUTPUT))
      (port (array (rename MEMDATAI "MEMDATAI(7:0)") 8) (direction INPUT))
      (port (array (rename MEMDATAO "MEMDATAO(7:0)") 8) (direction OUTPUT))
      (port MEMRD (direction OUTPUT))
      (port MEMWR (direction OUTPUT))
      (port (array (rename P0I "P0I(7:0)") 8) (direction INPUT))
      (port (array (rename P0O "P0O(7:0)") 8) (direction OUTPUT))
      (port (array (rename P1I "P1I(7:0)") 8) (direction INPUT))
      (port (array (rename P1O "P1O(7:0)") 8) (direction OUTPUT))
      (port (array (rename P2I "P2I(7:0)") 8) (direction INPUT))
      (port (array (rename P2O "P2O(7:0)") 8) (direction OUTPUT))
      (port (array (rename P3I "P3I(7:0)") 8) (direction INPUT))
      (port (array (rename P3O "P3O(7:0)") 8) (direction OUTPUT))
      (port PSRD (direction OUTPUT))
      (port PSWR (direction OUTPUT))
      (port (array (rename ROMADDR "ROMADDR(15:0)") 16) (direction OUTPUT))
      (port (array (rename ROMDATAI "ROMDATAI(7:0)") 8) (direction INPUT))
      (port (array (rename ROMDATAO "ROMDATAO(7:0)") 8) (direction OUTPUT))
      (port ROMRD (direction OUTPUT))
      (port ROMWR (direction OUTPUT))
      (port RST (direction INPUT))
      (port RXD (direction INPUT))
      (port RXDO (direction OUTPUT))
      (port (array (rename SFRADDR "SFRADDR(6:0)") 7) (direction OUTPUT))
      (port (array (rename SFRDATAI "SFRDATAI(7:0)") 8) (direction INPUT))
      (port (array (rename SFRDATAO "SFRDATAO(7:0)") 8) (direction OUTPUT))
      (port SFRRD (direction OUTPUT))
      (port SFRWR (direction OUTPUT))
      (port T0 (direction INPUT))
```

```
      (port T1 (direction INPUT))
      (port TCK (direction INPUT))
      (port TDI (direction INPUT))
      (port TDO (direction OUTPUT))
      (port TMS (direction INPUT))
      (port TRST (direction INPUT))
      (port TXD (direction OUTPUT)))))
   (cell J4B2_8B (celltype GENERIC) (view view_1 (viewType NETLIST)
     (interface
      (port (array (rename IA "IA(3:0)") 4) (direction INPUT))
      (port (array (rename IB "IB(3:0)") 4) (direction INPUT))
      (port (array (rename O "O(7:0)") 8) (direction OUTPUT)))))
   (cell IOBUF8B (celltype GENERIC) (view view_1 (viewType NETLIST)
     (interface
      (port I_7 (direction INPUT))
      (port I_6 (direction INPUT))
      (port I_5 (direction INPUT))
      (port I_4 (direction INPUT))
      (port I_3 (direction INPUT))
      (port I_2 (direction INPUT))
      (port I_1 (direction INPUT))
      (port I_0 (direction INPUT))
      (port IO__IN_7 (direction INPUT))
      (port IO__IN_6 (direction INPUT))
      (port IO__IN_5 (direction INPUT))
      (port IO__IN_4 (direction INPUT))
      (port IO__IN_3 (direction INPUT))
      (port IO__IN_2 (direction INPUT))
      (port IO__IN_1 (direction INPUT))
      (port IO__IN_0 (direction INPUT))
      (port T (direction INPUT))
      (port IO_7 (direction OUTPUT))
      (port IO_6 (direction OUTPUT))
      (port IO_5 (direction OUTPUT))
      (port IO_4 (direction OUTPUT))
      (port IO_3 (direction OUTPUT))
      (port IO_2 (direction OUTPUT))
      (port IO_1 (direction OUTPUT))
      (port IO_0 (direction OUTPUT))
      (port O_7 (direction OUTPUT))
      (port O_6 (direction OUTPUT))
      (port O_5 (direction OUTPUT))
      (port O_4 (direction OUTPUT))
      (port O_3 (direction OUTPUT))
      (port O_2 (direction OUTPUT))
      (port O_1 (direction OUTPUT))
      (port O_0 (direction OUTPUT)))
     (contents
      (instance (rename IO_0 "IO<0>") (viewref view_1 (cellRef OBUFT))
        (property HDL_SOURCE (string "IOBUF8B.VHD : 30")))
      (instance (rename IO_1 "IO<1>") (viewref view_1 (cellRef OBUFT))
        (property HDL_SOURCE (string "IOBUF8B.VHD : 30")))
      (instance (rename IO_2 "IO<2>") (viewref view_1 (cellRef OBUFT))
        (property HDL_SOURCE (string "IOBUF8B.VHD : 30")))
```

```
(instance (rename IO_3 "IO<3>") (viewref view_1 (cellRef OBUFT))
 (property HDL_SOURCE (string "IOBUF8B.VHD : 30")))
(instance (rename IO_4 "IO<4>") (viewref view_1 (cellRef OBUFT))
 (property HDL_SOURCE (string "IOBUF8B.VHD : 30")))
(instance (rename IO_5 "IO<5>") (viewref view_1 (cellRef OBUFT))
 (property HDL_SOURCE (string "IOBUF8B.VHD : 30")))
(instance (rename IO_6 "IO<6>") (viewref view_1 (cellRef OBUFT))
 (property HDL_SOURCE (string "IOBUF8B.VHD : 30")))
(instance (rename IO_7 "IO<7>") (viewref view_1 (cellRef OBUFT))
 (property HDL_SOURCE (string "IOBUF8B.VHD : 30")))
(net I_7 (joined
  (portRef I_7)
  (portRef I  (instanceRef IO_7))))
(net I_6 (joined
  (portRef I_6)
  (portRef I  (instanceRef IO_6))))
(net I_5 (joined
  (portRef I_5)
  (portRef I  (instanceRef IO_5))))
(net I_4 (joined
  (portRef I_4)
  (portRef I  (instanceRef IO_4))))
(net I_3 (joined
  (portRef I_3)
  (portRef I  (instanceRef IO_3))))
(net I_2 (joined
  (portRef I_2)
  (portRef I  (instanceRef IO_2))))
(net I_1 (joined
  (portRef I_1)
  (portRef I  (instanceRef IO_1))))
(net I_0 (joined
  (portRef I_0)
  (portRef I  (instanceRef IO_0))))
(net IO_7 (joined
  (portRef O  (instanceRef IO_7))
  (portRef IO_7)))
(net IO__IN_7 (joined
  (portRef IO__IN_7)
  (portRef O_7)))
(net IO_6 (joined
  (portRef O  (instanceRef IO_6))
  (portRef IO_6)))
(net IO__IN_6 (joined
  (portRef IO__IN_6)
  (portRef O_6)))
(net IO_5 (joined
  (portRef O  (instanceRef IO_5))
  (portRef IO_5)))
(net IO__IN_5 (joined
  (portRef IO__IN_5)
  (portRef O_5)))
(net IO_4 (joined
  (portRef O  (instanceRef IO_4))
```

```
          (portRef IO_4)))
        (net IO__IN_4 (joined
          (portRef IO__IN_4)
          (portRef O_4)))
        (net IO_3 (joined
          (portRef O   (instanceRef IO_3))
          (portRef IO_3)))
        (net IO__IN_3 (joined
          (portRef IO__IN_3)
          (portRef O_3)))
        (net IO_2 (joined
          (portRef O   (instanceRef IO_2))
          (portRef IO_2)))
        (net IO__IN_2 (joined
          (portRef IO__IN_2)
          (portRef O_2)))
        (net IO_1 (joined
          (portRef O   (instanceRef IO_1))
          (portRef IO_1)))
        (net IO__IN_1 (joined
          (portRef IO__IN_1)
          (portRef O_1)))
        (net IO_0 (joined
          (portRef O   (instanceRef IO_0))
          (portRef IO_0)))
        (net IO__IN_0 (joined
          (portRef IO__IN_0)
          (portRef O_0)))
        (net T (joined
          (portRef T)
          (portRef T   (instanceRef IO_0))
          (portRef T   (instanceRef IO_1))
          (portRef T   (instanceRef IO_2))
          (portRef T   (instanceRef IO_3))
          (portRef T   (instanceRef IO_4))
          (portRef T   (instanceRef IO_5))
          (portRef T   (instanceRef IO_6))
          (portRef T   (instanceRef IO_7))))))))
  (cell Buzzer (celltype GENERIC) (view view_1 (viewType NETLIST)
    (interface
      (port BUSY (direction INPUT))
      (port CLK (direction INPUT))
      (port JTAG_NEXUS_TCK (direction INPUT))
      (port JTAG_NEXUS_TDI (direction INPUT))
      (port JTAG_NEXUS_TMS (direction INPUT))
      (port JTAG_NEXUS_TRST (direction INPUT))
      (port PAI_7 (direction INPUT))
      (port PAI_6 (direction INPUT))
      (port PAI_5 (direction INPUT))
      (port PAI_4 (direction INPUT))
      (port PAI_3 (direction INPUT))
      (port PAI_2 (direction INPUT))
      (port PAI_1 (direction INPUT))
      (port PAI_0 (direction INPUT))
```

```
      (port PBI_7 (direction INPUT))
      (port PBI_6 (direction INPUT))
      (port PBI_5 (direction INPUT))
      (port PBI_4 (direction INPUT))
      (port PBI_3 (direction INPUT))
      (port PBI_2 (direction INPUT))
      (port PBI_1 (direction INPUT))
      (port PBI_0 (direction INPUT))
      (port RST (direction INPUT))
      (port ADDR_3 (direction OUTPUT))
      (port ADDR_2 (direction OUTPUT))
      (port ADDR_1 (direction OUTPUT))
      (port ADDR_0 (direction OUTPUT))
      (port DATA_7 (direction OUTPUT))
      (port DATA_6 (direction OUTPUT))
      (port DATA_5 (direction OUTPUT))
      (port DATA_4 (direction OUTPUT))
      (port DATA_3 (direction OUTPUT))
      (port DATA_2 (direction OUTPUT))
      (port DATA_1 (direction OUTPUT))
      (port DATA_0 (direction OUTPUT))
      (port JTAG_NEXUS_TDO (direction OUTPUT))
      (port LINE (direction OUTPUT))
      (port SPEAKER (direction OUTPUT))
      (port STROBE (direction OUTPUT)))
     (contents
      (instance n6i (viewref view_1 (cellRef GND)))
      (instance n6j (viewref view_1 (cellRef VCC)))
      (instance U5 (viewref view_1 (cellRef M1_S2S1))
       (property HDL_SOURCE (string "Buzzer.VHD : 209"))
       (property VHDLIB_SIM (string "GENERIC_LIB")))
      (instance U11 (viewref view_1 (cellRef J8S_8B))
       (property HDL_SOURCE (string "Buzzer.VHD : 179")))
      (instance M1 (viewref view_1 (cellRef Memory_M1))
       (property HDL_SOURCE (string "Buzzer.VHD : 251")))
      (instance U9 (viewref view_1 (cellRef J8B_8S))
       (property HDL_SOURCE (string "Buzzer.VHD : 200")))
      (instance U10 (viewref view_1 (cellRef J8B_4B2))
       (property HDL_SOURCE (string "Buzzer.VHD : 193")))
      (instance P1 (viewref view_1 (cellRef TSK51A_D))
       (property HDL_SOURCE (string "Buzzer.VHD : 218")))
     (net BUSY (joined
        (portRef BUSY)
        (portRef I7   (instanceRef U11))))
     (net CLK (joined
        (portRef CLK)
        (portRef CLK   (instanceRef M1))
        (portRef CLK   (instanceRef P1))))
     (net JTAG_NEXUS_TCK (joined
        (portRef JTAG_NEXUS_TCK)
        (portRef TCK   (instanceRef P1))))
     (net JTAG_NEXUS_TDI (joined
        (portRef JTAG_NEXUS_TDI)
        (portRef TDI   (instanceRef P1))))
```

```
(net JTAG_NEXUS_TMS (joined
  (portRef JTAG_NEXUS_TMS)
  (portRef TMS   (instanceRef P1))))
(net JTAG_NEXUS_TRST (joined
  (portRef JTAG_NEXUS_TRST)
  (portRef TRST  (instanceRef P1))))
(net PAI_7 (joined
  (portRef PAI_7)
  (portRef (member P0I 0)   (instanceRef P1))))
(net PAI_6 (joined
  (portRef PAI_6)
  (portRef (member P0I 1)   (instanceRef P1))))
(net PAI_5 (joined
  (portRef PAI_5)
  (portRef (member P0I 2)   (instanceRef P1))))
(net PAI_4 (joined
  (portRef PAI_4)
  (portRef (member P0I 3)   (instanceRef P1))))
(net PAI_3 (joined
  (portRef PAI_3)
  (portRef (member P0I 4)   (instanceRef P1))))
(net PAI_2 (joined
  (portRef PAI_2)
  (portRef (member P0I 5)   (instanceRef P1))))
(net PAI_1 (joined
  (portRef PAI_1)
  (portRef (member P0I 6)   (instanceRef P1))))
(net PAI_0 (joined
  (portRef PAI_0)
  (portRef (member P0I 7)   (instanceRef P1))))
(net PBI_7 (joined
  (portRef PBI_7)
  (portRef (member P1I 0)   (instanceRef P1))))
(net PBI_6 (joined
  (portRef PBI_6)
  (portRef (member P1I 1)   (instanceRef P1))))
(net PBI_5 (joined
  (portRef PBI_5)
  (portRef (member P1I 2)   (instanceRef P1))))
(net PBI_4 (joined
  (portRef PBI_4)
  (portRef (member P1I 3)   (instanceRef P1))))
(net PBI_3 (joined
  (portRef PBI_3)
  (portRef (member P1I 4)   (instanceRef P1))))
(net PBI_2 (joined
  (portRef PBI_2)
  (portRef (member P1I 5)   (instanceRef P1))))
(net PBI_1 (joined
  (portRef PBI_1)
  (portRef (member P1I 6)   (instanceRef P1))))
(net PBI_0 (joined
  (portRef PBI_0)
  (portRef (member P1I 7)   (instanceRef P1))))
```

```
(net RST (joined
  (portRef RST)
  (portRef RST   (instanceRef P1))))
(net n6i (joined
  (portRef G    (instanceRef n6i))
  (portRef I0   (instanceRef U11))
  (portRef I1   (instanceRef U11))
  (portRef I2   (instanceRef U11))
  (portRef I3   (instanceRef U11))
  (portRef I4   (instanceRef U11))
  (portRef I5   (instanceRef U11))
  (portRef I6   (instanceRef U11))
  (portRef D1   (instanceRef U5))
  (portRef EA   (instanceRef P1))
  (portRef INT0  (instanceRef P1))
  (portRef INT1  (instanceRef P1))
  (portRef (member P2I 0)   (instanceRef P1))
  (portRef (member P2I 1)   (instanceRef P1))
  (portRef (member P2I 2)   (instanceRef P1))
  (portRef (member P2I 3)   (instanceRef P1))
  (portRef (member P2I 4)   (instanceRef P1))
  (portRef (member P2I 5)   (instanceRef P1))
  (portRef (member P2I 6)   (instanceRef P1))
  (portRef (member P2I 7)   (instanceRef P1))
  (portRef RXD  (instanceRef P1))
  (portRef T0   (instanceRef P1))
  (portRef T1   (instanceRef P1))))
(net PinSignal_P1_P2O_7 (joined
  (portRef (member P2O 0)   (instanceRef P1))
  (portRef (member I 0)   (instanceRef U10))))
(net PinSignal_P1_P2O_6 (joined
  (portRef (member P2O 1)   (instanceRef P1))
  (portRef (member I 1)   (instanceRef U10))))
(net PinSignal_P1_P2O_5 (joined
  (portRef (member P2O 2)   (instanceRef P1))
  (portRef (member I 2)   (instanceRef U10))))
(net PinSignal_P1_P2O_4 (joined
  (portRef (member P2O 3)   (instanceRef P1))
  (portRef (member I 3)   (instanceRef U10))))
(net PinSignal_P1_P2O_3 (joined
  (portRef (member P2O 4)   (instanceRef P1))
  (portRef (member I 4)   (instanceRef U10))))
(net PinSignal_P1_P2O_2 (joined
  (portRef (member P2O 5)   (instanceRef P1))
  (portRef (member I 5)   (instanceRef U10))))
(net PinSignal_P1_P2O_1 (joined
  (portRef (member P2O 6)   (instanceRef P1))
  (portRef (member I 6)   (instanceRef U10))))
(net PinSignal_P1_P2O_0 (joined
  (portRef (member P2O 7)   (instanceRef P1))
  (portRef (member I 7)   (instanceRef U10))))
(net PinSignal_P1_P3O_7 (joined
  (portRef (member P3O 0)   (instanceRef P1))
  (portRef (member I 0)   (instanceRef U9))))
```

```
(net PinSignal_P1_P3O_6 (joined
    (portRef (member P3O 1)   (instanceRef P1))
    (portRef (member I 1)   (instanceRef U9))))
(net PinSignal_P1_P3O_5 (joined
    (portRef (member P3O 2)   (instanceRef P1))
    (portRef (member I 2)   (instanceRef U9))))
(net PinSignal_P1_P3O_4 (joined
    (portRef (member P3O 3)   (instanceRef P1))
    (portRef (member I 3)   (instanceRef U9))))
(net PinSignal_P1_P3O_3 (joined
    (portRef (member P3O 4)   (instanceRef P1))
    (portRef (member I 4)   (instanceRef U9))))
(net PinSignal_P1_P3O_2 (joined
    (portRef (member P3O 5)   (instanceRef P1))
    (portRef (member I 5)   (instanceRef U9))))
(net PinSignal_P1_P3O_1 (joined
    (portRef (member P3O 6)   (instanceRef P1))
    (portRef (member I 6)   (instanceRef U9))))
(net PinSignal_P1_P3O_0 (joined
    (portRef (member P3O 7)   (instanceRef P1))
    (portRef (member I 7)   (instanceRef U9))))
(net PinSignal_U9_O0 (joined
    (portRef O0   (instanceRef U9))
    (portRef D0   (instanceRef U5))))
(net PinSignal_U9_O4 (joined
    (portRef O4   (instanceRef U9))
    (portRef S0   (instanceRef U5))))
(net PinSignal_P1_MEMDATAO_7 (joined
    (portRef (member MEMDATAO 0)   (instanceRef P1))
    (portRef (member MEMDATAI 0)   (instanceRef P1))))
(net PinSignal_P1_MEMDATAO_6 (joined
    (portRef (member MEMDATAO 1)   (instanceRef P1))
    (portRef (member MEMDATAI 1)   (instanceRef P1))))
(net PinSignal_P1_MEMDATAO_5 (joined
    (portRef (member MEMDATAO 2)   (instanceRef P1))
    (portRef (member MEMDATAI 2)   (instanceRef P1))))
(net PinSignal_P1_MEMDATAO_4 (joined
    (portRef (member MEMDATAO 3)   (instanceRef P1))
    (portRef (member MEMDATAI 3)   (instanceRef P1))))
(net PinSignal_P1_MEMDATAO_3 (joined
    (portRef (member MEMDATAO 4)   (instanceRef P1))
    (portRef (member MEMDATAI 4)   (instanceRef P1))))
(net PinSignal_P1_MEMDATAO_2 (joined
    (portRef (member MEMDATAO 5)   (instanceRef P1))
    (portRef (member MEMDATAI 5)   (instanceRef P1))))
(net PinSignal_P1_MEMDATAO_1 (joined
    (portRef (member MEMDATAO 6)   (instanceRef P1))
    (portRef (member MEMDATAI 6)   (instanceRef P1))))
(net PinSignal_P1_MEMDATAO_0 (joined
    (portRef (member MEMDATAO 7)   (instanceRef P1))
    (portRef (member MEMDATAI 7)   (instanceRef P1))))
(net PinSignal_U11_O_7 (joined
    (portRef (member O 0)   (instanceRef U11))
    (portRef (member P3I 0)   (instanceRef P1))))
```

```
(net PinSignal_U11_O_6 (joined
  (portRef (member O 1)   (instanceRef U11))
  (portRef (member P3I 1)   (instanceRef P1))))
(net PinSignal_U11_O_5 (joined
  (portRef (member O 2)   (instanceRef U11))
  (portRef (member P3I 2)   (instanceRef P1))))
(net PinSignal_U11_O_4 (joined
  (portRef (member O 3)   (instanceRef U11))
  (portRef (member P3I 3)   (instanceRef P1))))
(net PinSignal_U11_O_3 (joined
  (portRef (member O 4)   (instanceRef U11))
  (portRef (member P3I 4)   (instanceRef P1))))
(net PinSignal_U11_O_2 (joined
  (portRef (member O 5)   (instanceRef U11))
  (portRef (member P3I 5)   (instanceRef P1))))
(net PinSignal_U11_O_1 (joined
  (portRef (member O 6)   (instanceRef U11))
  (portRef (member P3I 6)   (instanceRef P1))))
(net PinSignal_U11_O_0 (joined
  (portRef (member O 7)   (instanceRef U11))
  (portRef (member P3I 7)   (instanceRef P1))))
(net PinSignal_M1_DOUT_7 (joined
  (portRef (member DOUT 0)   (instanceRef M1))
  (portRef (member ROMDATAI 0)   (instanceRef P1))))
(net PinSignal_M1_DOUT_6 (joined
  (portRef (member DOUT 1)   (instanceRef M1))
  (portRef (member ROMDATAI 1)   (instanceRef P1))))
(net PinSignal_M1_DOUT_5 (joined
  (portRef (member DOUT 2)   (instanceRef M1))
  (portRef (member ROMDATAI 2)   (instanceRef P1))))
(net PinSignal_M1_DOUT_4 (joined
  (portRef (member DOUT 3)   (instanceRef M1))
  (portRef (member ROMDATAI 3)   (instanceRef P1))))
(net PinSignal_M1_DOUT_3 (joined
  (portRef (member DOUT 4)   (instanceRef M1))
  (portRef (member ROMDATAI 4)   (instanceRef P1))))
(net PinSignal_M1_DOUT_2 (joined
  (portRef (member DOUT 5)   (instanceRef M1))
  (portRef (member ROMDATAI 5)   (instanceRef P1))))
(net PinSignal_M1_DOUT_1 (joined
  (portRef (member DOUT 6)   (instanceRef M1))
  (portRef (member ROMDATAI 6)   (instanceRef P1))))
(net PinSignal_M1_DOUT_0 (joined
  (portRef (member DOUT 7)   (instanceRef M1))
  (portRef (member ROMDATAI 7)   (instanceRef P1))))
(net n6j (joined
  (portRef P   (instanceRef n6j))
  (portRef (member SFRDATAI 0)   (instanceRef P1))
  (portRef (member SFRDATAI 1)   (instanceRef P1))
  (portRef (member SFRDATAI 2)   (instanceRef P1))
  (portRef (member SFRDATAI 3)   (instanceRef P1))
  (portRef (member SFRDATAI 4)   (instanceRef P1))
  (portRef (member SFRDATAI 5)   (instanceRef P1))
  (portRef (member SFRDATAI 6)   (instanceRef P1))
```

```
      (portRef (member SFRDATAI 7)   (instanceRef P1))))
(net PinSignal_P1_ROMADDR_9 (joined
   (portRef (member ROMADDR 6)   (instanceRef P1))
   (portRef (member ADDR 0)   (instanceRef M1))))
(net PinSignal_P1_ROMADDR_8 (joined
   (portRef (member ROMADDR 7)   (instanceRef P1))
   (portRef (member ADDR 1)   (instanceRef M1))))
(net PinSignal_P1_ROMADDR_7 (joined
   (portRef (member ROMADDR 8)   (instanceRef P1))
   (portRef (member ADDR 2)   (instanceRef M1))))
(net PinSignal_P1_ROMADDR_6 (joined
   (portRef (member ROMADDR 9)   (instanceRef P1))
   (portRef (member ADDR 3)   (instanceRef M1))))
(net PinSignal_P1_ROMADDR_5 (joined
   (portRef (member ROMADDR 10)   (instanceRef P1))
   (portRef (member ADDR 4)   (instanceRef M1))))
(net PinSignal_P1_ROMADDR_4 (joined
   (portRef (member ROMADDR 11)   (instanceRef P1))
   (portRef (member ADDR 5)   (instanceRef M1))))
(net PinSignal_P1_ROMADDR_3 (joined
   (portRef (member ROMADDR 12)   (instanceRef P1))
   (portRef (member ADDR 6)   (instanceRef M1))))
(net PinSignal_P1_ROMADDR_2 (joined
   (portRef (member ROMADDR 13)   (instanceRef P1))
   (portRef (member ADDR 7)   (instanceRef M1))))
(net PinSignal_P1_ROMADDR_1 (joined
   (portRef (member ROMADDR 14)   (instanceRef P1))
   (portRef (member ADDR 8)   (instanceRef M1))))
(net PinSignal_P1_ROMADDR_0 (joined
   (portRef (member ROMADDR 15)   (instanceRef P1))
   (portRef (member ADDR 9)   (instanceRef M1))))
(net PinSignal_P1_ROMDATAO_7 (joined
   (portRef (member ROMDATAO 0)   (instanceRef P1))
   (portRef (member DIN 0)   (instanceRef M1))))
(net PinSignal_P1_ROMDATAO_6 (joined
   (portRef (member ROMDATAO 1)   (instanceRef P1))
   (portRef (member DIN 1)   (instanceRef M1))))
(net PinSignal_P1_ROMDATAO_5 (joined
   (portRef (member ROMDATAO 2)   (instanceRef P1))
   (portRef (member DIN 2)   (instanceRef M1))))
(net PinSignal_P1_ROMDATAO_4 (joined
   (portRef (member ROMDATAO 3)   (instanceRef P1))
   (portRef (member DIN 3)   (instanceRef M1))))
(net PinSignal_P1_ROMDATAO_3 (joined
   (portRef (member ROMDATAO 4)   (instanceRef P1))
   (portRef (member DIN 4)   (instanceRef M1))))
(net PinSignal_P1_ROMDATAO_2 (joined
   (portRef (member ROMDATAO 5)   (instanceRef P1))
   (portRef (member DIN 5)   (instanceRef M1))))
(net PinSignal_P1_ROMDATAO_1 (joined
   (portRef (member ROMDATAO 6)   (instanceRef P1))
   (portRef (member DIN 6)   (instanceRef M1))))
(net PinSignal_P1_ROMDATAO_0 (joined
   (portRef (member ROMDATAO 7)   (instanceRef P1))
```

```
          (portRef (member DIN 7)   (instanceRef M1))))
        (net PinSignal_P1_ROMWR (joined
          (portRef ROMWR   (instanceRef P1))
          (portRef WE    (instanceRef M1))))
        (net ADDR_3 (joined
          (portRef (member OA 0)   (instanceRef U10))
          (portRef ADDR_3)))
        (net ADDR_2 (joined
          (portRef (member OA 1)   (instanceRef U10))
          (portRef ADDR_2)))
        (net ADDR_1 (joined
          (portRef (member OA 2)   (instanceRef U10))
          (portRef ADDR_1)))
        (net ADDR_0 (joined
          (portRef (member OA 3)   (instanceRef U10))
          (portRef ADDR_0)))
        (net DATA_7 (joined
          (portRef (member P0O 0)   (instanceRef P1))
          (portRef DATA_7)))
        (net DATA_6 (joined
          (portRef (member P0O 1)   (instanceRef P1))
          (portRef DATA_6)))
        (net DATA_5 (joined
          (portRef (member P0O 2)   (instanceRef P1))
          (portRef DATA_5)))
        (net DATA_4 (joined
          (portRef (member P0O 3)   (instanceRef P1))
          (portRef DATA_4)))
        (net DATA_3 (joined
          (portRef (member P0O 4)   (instanceRef P1))
          (portRef DATA_3)))
        (net DATA_2 (joined
          (portRef (member P0O 5)   (instanceRef P1))
          (portRef DATA_2)))
        (net DATA_1 (joined
          (portRef (member P0O 6)   (instanceRef P1))
          (portRef DATA_1)))
        (net DATA_0 (joined
          (portRef (member P0O 7)   (instanceRef P1))
          (portRef DATA_0)))
        (net JTAG_NEXUS_TDO (joined
          (portRef TDO   (instanceRef P1))
          (portRef JTAG_NEXUS_TDO)))
        (net LINE (joined
          (portRef O1   (instanceRef U9))
          (portRef LINE)))
        (net SPEAKER (joined
          (portRef (member P1O 7)   (instanceRef P1))
          (portRef SPEAKER)))
        (net STROBE (joined
          (portRef O   (instanceRef U5))
          (portRef STROBE))))))
  (cell Keypad (celltype GENERIC) (view view_1 (viewType NETLIST)
    (interface
```

```
(port CLK (direction INPUT))
(port INA_3 (direction INPUT))
(port INA_2 (direction INPUT))
(port INA_1 (direction INPUT))
(port INA_0 (direction INPUT))
(port JTAG_NEXUS_TCK (direction INPUT))
(port JTAG_NEXUS_TDI (direction INPUT))
(port JTAG_NEXUS_TMS (direction INPUT))
(port JTAG_NEXUS_TRST (direction INPUT))
(port RST (direction INPUT))
(port JTAG_NEXUS_TDO (direction OUTPUT))
(port OUTA_3 (direction OUTPUT))
(port OUTA_2 (direction OUTPUT))
(port OUTA_1 (direction OUTPUT))
(port OUTA_0 (direction OUTPUT))
(port OUTB_7 (direction OUTPUT))
(port OUTB_6 (direction OUTPUT))
(port OUTB_5 (direction OUTPUT))
(port OUTB_4 (direction OUTPUT))
(port OUTB_3 (direction OUTPUT))
(port OUTB_2 (direction OUTPUT))
(port OUTB_1 (direction OUTPUT))
(port OUTB_0 (direction OUTPUT))
(port OUTC_7 (direction OUTPUT))
(port OUTC_6 (direction OUTPUT))
(port OUTC_5 (direction OUTPUT))
(port OUTC_4 (direction OUTPUT))
(port OUTC_3 (direction OUTPUT))
(port OUTC_2 (direction OUTPUT))
(port OUTC_1 (direction OUTPUT))
(port OUTC_0 (direction OUTPUT)))
(contents
(instance n3w (viewref view_1 (cellRef GND)))
(instance P2 (viewref view_1 (cellRef TSK165B_D))
  (property HDL_SOURCE (string "Keypad.VHD : 117")))
(instance M2 (viewref view_1 (cellRef Memory_M2))
  (property HDL_SOURCE (string "Keypad.VHD : 141")))
(instance U4 (viewref view_1 (cellRef J4B2_8B))
  (property HDL_SOURCE (string "Keypad.VHD : 109")))
(net CLK (joined
  (portRef CLK)
  (portRef CLK  (instanceRef P2))
  (portRef CLK  (instanceRef M2))))
(net INA_3 (joined
  (portRef INA_3)
  (portRef (member IA 0)  (instanceRef U4))))
(net INA_2 (joined
  (portRef INA_2)
  (portRef (member IA 1)  (instanceRef U4))))
(net INA_1 (joined
  (portRef INA_1)
  (portRef (member IA 2)  (instanceRef U4))))
(net INA_0 (joined
  (portRef INA_0)
```

```
      (portRef (member IA 3)   (instanceRef U4))))
(net JTAG_NEXUS_TCK (joined
  (portRef JTAG_NEXUS_TCK)
  (portRef TCK   (instanceRef P2))))
(net JTAG_NEXUS_TDI (joined
  (portRef JTAG_NEXUS_TDI)
  (portRef TDI   (instanceRef P2))))
(net JTAG_NEXUS_TMS (joined
  (portRef JTAG_NEXUS_TMS)
  (portRef TMS   (instanceRef P2))))
(net JTAG_NEXUS_TRST (joined
  (portRef JTAG_NEXUS_TRST)
  (portRef TRST   (instanceRef P2))))
(net RST (joined
  (portRef RST)
  (portRef POWERUP   (instanceRef P2))
  (portRef RST   (instanceRef P2))))
(net n3w (joined
  (portRef G   (instanceRef n3w))
  (portRef (member IB 0)   (instanceRef U4))
  (portRef (member IB 1)   (instanceRef U4))
  (portRef (member IB 2)   (instanceRef U4))
  (portRef (member IB 3)   (instanceRef U4))
  (portRef WDTO   (instanceRef P2))))
(net PinSignal_U4_O_7 (joined
  (portRef (member O 0)   (instanceRef U4))
  (portRef (member RAI 0)   (instanceRef P2))))
(net PinSignal_U4_O_6 (joined
  (portRef (member O 1)   (instanceRef U4))
  (portRef (member RAI 1)   (instanceRef P2))))
(net PinSignal_U4_O_5 (joined
  (portRef (member O 2)   (instanceRef U4))
  (portRef (member RAI 2)   (instanceRef P2))))
(net PinSignal_U4_O_4 (joined
  (portRef (member O 3)   (instanceRef U4))
  (portRef (member RAI 3)   (instanceRef P2))))
(net PinSignal_U4_O_3 (joined
  (portRef (member O 4)   (instanceRef U4))
  (portRef (member RAI 4)   (instanceRef P2))))
(net PinSignal_U4_O_2 (joined
  (portRef (member O 5)   (instanceRef U4))
  (portRef (member RAI 5)   (instanceRef P2))))
(net PinSignal_U4_O_1 (joined
  (portRef (member O 6)   (instanceRef U4))
  (portRef (member RAI 6)   (instanceRef P2))))
(net PinSignal_U4_O_0 (joined
  (portRef (member O 7)   (instanceRef U4))
  (portRef (member RAI 7)   (instanceRef P2))))
(net OUTB_7 (joined
  (portRef (member RBO 0)   (instanceRef P2))
  (portRef (member RBI 0)   (instanceRef P2))
  (portRef OUTB_7)))
(net OUTB_6 (joined
  (portRef (member RBO 1)   (instanceRef P2))
```

```
        (portRef (member RBI 1)    (instanceRef P2))
        (portRef OUTB_6)))
(net OUTB_5 (joined
        (portRef (member RBO 2)    (instanceRef P2))
        (portRef (member RBI 2)    (instanceRef P2))
        (portRef OUTB_5)))
(net OUTB_4 (joined
        (portRef (member RBO 3)    (instanceRef P2))
        (portRef (member RBI 3)    (instanceRef P2))
        (portRef OUTB_4)))
(net OUTB_3 (joined
        (portRef (member RBO 4)    (instanceRef P2))
        (portRef (member RBI 4)    (instanceRef P2))
        (portRef OUTB_3)))
(net OUTB_2 (joined
        (portRef (member RBO 5)    (instanceRef P2))
        (portRef (member RBI 5)    (instanceRef P2))
        (portRef OUTB_2)))
(net OUTB_1 (joined
        (portRef (member RBO 6)    (instanceRef P2))
        (portRef (member RBI 6)    (instanceRef P2))
        (portRef OUTB_1)))
(net OUTB_0 (joined
        (portRef (member RBO 7)    (instanceRef P2))
        (portRef (member RBI 7)    (instanceRef P2))
        (portRef OUTB_0)))
(net OUTC_7 (joined
        (portRef (member RCO 0)    (instanceRef P2))
        (portRef (member RCI 0)    (instanceRef P2))
        (portRef OUTC_7)))
(net OUTC_6 (joined
        (portRef (member RCO 1)    (instanceRef P2))
        (portRef (member RCI 1)    (instanceRef P2))
        (portRef OUTC_6)))
(net OUTC_5 (joined
        (portRef (member RCO 2)    (instanceRef P2))
        (portRef (member RCI 2)    (instanceRef P2))
        (portRef OUTC_5)))
(net OUTC_4 (joined
        (portRef (member RCO 3)    (instanceRef P2))
        (portRef (member RCI 3)    (instanceRef P2))
        (portRef OUTC_4)))
(net OUTC_3 (joined
        (portRef (member RCO 4)    (instanceRef P2))
        (portRef (member RCI 4)    (instanceRef P2))
        (portRef OUTC_3)))
(net OUTC_2 (joined
        (portRef (member RCO 5)    (instanceRef P2))
        (portRef (member RCI 5)    (instanceRef P2))
        (portRef OUTC_2)))
(net OUTC_1 (joined
        (portRef (member RCO 6)    (instanceRef P2))
        (portRef (member RCI 6)    (instanceRef P2))
        (portRef OUTC_1)))
```

```
(net OUTC_0 (joined
  (portRef (member RCO 7)   (instanceRef P2))
  (portRef (member RCI 7)   (instanceRef P2))
  (portRef OUTC_0)))
(net PinSignal_M2_DOUT_11 (joined
  (portRef (member DOUT 0)   (instanceRef M2))
  (portRef (member ROMDATAI 0)   (instanceRef P2))))
(net PinSignal_M2_DOUT_10 (joined
  (portRef (member DOUT 1)   (instanceRef M2))
  (portRef (member ROMDATAI 1)   (instanceRef P2))))
(net PinSignal_M2_DOUT_9 (joined
  (portRef (member DOUT 2)   (instanceRef M2))
  (portRef (member ROMDATAI 2)   (instanceRef P2))))
(net PinSignal_M2_DOUT_8 (joined
  (portRef (member DOUT 3)   (instanceRef M2))
  (portRef (member ROMDATAI 3)   (instanceRef P2))))
(net PinSignal_M2_DOUT_7 (joined
  (portRef (member DOUT 4)   (instanceRef M2))
  (portRef (member ROMDATAI 4)   (instanceRef P2))))
(net PinSignal_M2_DOUT_6 (joined
  (portRef (member DOUT 5)   (instanceRef M2))
  (portRef (member ROMDATAI 5)   (instanceRef P2))))
(net PinSignal_M2_DOUT_5 (joined
  (portRef (member DOUT 6)   (instanceRef M2))
  (portRef (member ROMDATAI 6)   (instanceRef P2))))
(net PinSignal_M2_DOUT_4 (joined
  (portRef (member DOUT 7)   (instanceRef M2))
  (portRef (member ROMDATAI 7)   (instanceRef P2))))
(net PinSignal_M2_DOUT_3 (joined
  (portRef (member DOUT 8)   (instanceRef M2))
  (portRef (member ROMDATAI 8)   (instanceRef P2))))
(net PinSignal_M2_DOUT_2 (joined
  (portRef (member DOUT 9)   (instanceRef M2))
  (portRef (member ROMDATAI 9)   (instanceRef P2))))
(net PinSignal_M2_DOUT_1 (joined
  (portRef (member DOUT 10)   (instanceRef M2))
  (portRef (member ROMDATAI 10)   (instanceRef P2))))
(net PinSignal_M2_DOUT_0 (joined
  (portRef (member DOUT 11)   (instanceRef M2))
  (portRef (member ROMDATAI 11)   (instanceRef P2))))
(net PinSignal_P2_ROMADDR_8 (joined
  (portRef (member ROMADDR 2)   (instanceRef P2))
  (portRef (member ADDR 0)   (instanceRef M2))))
(net PinSignal_P2_ROMADDR_7 (joined
  (portRef (member ROMADDR 3)   (instanceRef P2))
  (portRef (member ADDR 1)   (instanceRef M2))))
(net PinSignal_P2_ROMADDR_6 (joined
  (portRef (member ROMADDR 4)   (instanceRef P2))
  (portRef (member ADDR 2)   (instanceRef M2))))
(net PinSignal_P2_ROMADDR_5 (joined
  (portRef (member ROMADDR 5)   (instanceRef P2))
  (portRef (member ADDR 3)   (instanceRef M2))))
(net PinSignal_P2_ROMADDR_4 (joined
  (portRef (member ROMADDR 6)   (instanceRef P2))
```

```
      (portRef (member ADDR 4)   (instanceRef M2))))
(net PinSignal_P2_ROMADDR_3 (joined
   (portRef (member ROMADDR 7)   (instanceRef P2))
   (portRef (member ADDR 5)   (instanceRef M2))))
(net PinSignal_P2_ROMADDR_2 (joined
   (portRef (member ROMADDR 8)   (instanceRef P2))
   (portRef (member ADDR 6)   (instanceRef M2))))
(net PinSignal_P2_ROMADDR_1 (joined
   (portRef (member ROMADDR 9)   (instanceRef P2))
   (portRef (member ADDR 7)   (instanceRef M2))))
(net PinSignal_P2_ROMADDR_0 (joined
   (portRef (member ROMADDR 10)   (instanceRef P2))
   (portRef (member ADDR 8)   (instanceRef M2))))
(net PinSignal_P2_ROMDATAO_11 (joined
   (portRef (member ROMDATAO 0)   (instanceRef P2))
   (portRef (member DIN 0)   (instanceRef M2))))
(net PinSignal_P2_ROMDATAO_10 (joined
   (portRef (member ROMDATAO 1)   (instanceRef P2))
   (portRef (member DIN 1)   (instanceRef M2))))
(net PinSignal_P2_ROMDATAO_9 (joined
   (portRef (member ROMDATAO 2)   (instanceRef P2))
   (portRef (member DIN 2)   (instanceRef M2))))
(net PinSignal_P2_ROMDATAO_8 (joined
   (portRef (member ROMDATAO 3)   (instanceRef P2))
   (portRef (member DIN 3)   (instanceRef M2))))
(net PinSignal_P2_ROMDATAO_7 (joined
   (portRef (member ROMDATAO 4)   (instanceRef P2))
   (portRef (member DIN 4)   (instanceRef M2))))
(net PinSignal_P2_ROMDATAO_6 (joined
   (portRef (member ROMDATAO 5)   (instanceRef P2))
   (portRef (member DIN 5)   (instanceRef M2))))
(net PinSignal_P2_ROMDATAO_5 (joined
   (portRef (member ROMDATAO 6)   (instanceRef P2))
   (portRef (member DIN 6)   (instanceRef M2))))
(net PinSignal_P2_ROMDATAO_4 (joined
   (portRef (member ROMDATAO 7)   (instanceRef P2))
   (portRef (member DIN 7)   (instanceRef M2))))
(net PinSignal_P2_ROMDATAO_3 (joined
   (portRef (member ROMDATAO 8)   (instanceRef P2))
   (portRef (member DIN 8)   (instanceRef M2))))
(net PinSignal_P2_ROMDATAO_2 (joined
   (portRef (member ROMDATAO 9)   (instanceRef P2))
   (portRef (member DIN 9)   (instanceRef M2))))
(net PinSignal_P2_ROMDATAO_1 (joined
   (portRef (member ROMDATAO 10)   (instanceRef P2))
   (portRef (member DIN 10)   (instanceRef M2))))
(net PinSignal_P2_ROMDATAO_0 (joined
   (portRef (member ROMDATAO 11)   (instanceRef P2))
   (portRef (member DIN 11)   (instanceRef M2))))
(net PinSignal_P2_ROMWE (joined
   (portRef ROMWE   (instanceRef P2))
   (portRef WE   (instanceRef M2))))
(net JTAG_NEXUS_TDO (joined
   (portRef TDO   (instanceRef P2))
```

```
          (portRef JTAG_NEXUS_TDO)))
        (net OUTA_3 (joined
          (portRef (member RAO 4)   (instanceRef P2))
          (portRef OUTA_3)))
        (net OUTA_2 (joined
          (portRef (member RAO 5)   (instanceRef P2))
          (portRef OUTA_2)))
        (net OUTA_1 (joined
          (portRef (member RAO 6)   (instanceRef P2))
          (portRef OUTA_1)))
        (net OUTA_0 (joined
          (portRef (member RAO 7)   (instanceRef P2))
          (portRef OUTA_0)))))))
    (cell FPGA_51_C_165B_ASM_Buzzer (celltype GENERIC) (view view_1 (viewType
NETLIST)
      (interface
        (port CLK_BRD (direction INPUT)
         (property FPGA_CLOCK_PIN (string "TRUE"))
         (property LOC (string "P182")))
        (port JTAG_NEXUS_TCK (direction INPUT)
         (property LOC (string "P9")))
        (port JTAG_NEXUS_TDI (direction INPUT)
         (property LOC (string "P8")))
        (port JTAG_NEXUS_TMS (direction INPUT)
         (property LOC (string "P10")))
        (port (array (rename KP_COL "KP_COL(3:0)") 4) (direction INPUT)
         (property LOC (string "P102,P98,P97,P96")))
        (port TEST_BUTTON (direction INPUT)
         (property LOC (string "P3")))
        (port JTAG_NEXUS_TDO (direction OUTPUT)

(property LOC (string "P11")))
        (port (array (rename KP_ROW "KP_ROW(3:0)") 4) (direction OUTPUT)
         (property LOC (string "P101,P100,P99,P95")))
        (port (array (rename LCD_DB "LCD_DB(7:0)") 8) (direction INOUT)
         (property LOC (string "P88,P87,P86,P84,P83,P82,P81,P75")))
        (port LCD_E (direction OUTPUT)
         (property LOC (string "P89")))
        (port LCD_LIGHT (direction OUTPUT)
         (property LOC (string "P94")))
        (port LCD_RS (direction OUTPUT)
         (property LOC (string "P164")))
        (port LCD_RW (direction OUTPUT)
         (property LOC (string "P166")))
        (port SPEAKER (direction OUTPUT)
         (property LOC (string "P93")))
        (property JTAG_Index (string "0")))
      (contents
        (instance CLK_BRD_ibuf (viewref view_1 (cellRef IBUFG))
         (property LOC (string "P182")))
        (instance JTAG_NEXUS_TCK_ibuf (viewref view_1 (cellRef IBUF))
         (property LOC (string "P9")))
        (instance JTAG_NEXUS_TDI_ibuf (viewref view_1 (cellRef IBUF))
         (property LOC (string "P8")))
```

```
(instance JTAG_NEXUS_TMS_ibuf (viewref view_1 (cellRef IBUF))
 (property LOC (string "P10")))
(instance KP_COL_3_ibuf (viewref view_1 (cellRef IBUF))
 (property LOC (string "P102")))
(instance KP_COL_2_ibuf (viewref view_1 (cellRef IBUF))
 (property LOC (string "P98")))
(instance KP_COL_1_ibuf (viewref view_1 (cellRef IBUF))
 (property LOC (string "P97")))
(instance KP_COL_0_ibuf (viewref view_1 (cellRef IBUF))
 (property LOC (string "P96")))
(instance LCD_DB_7_ibuf (viewref view_1 (cellRef IBUF))
 (property LOC (string "P88")))
(instance LCD_DB_6_ibuf (viewref view_1 (cellRef IBUF))
 (property LOC (string "P87")))
(instance LCD_DB_5_ibuf (viewref view_1 (cellRef IBUF))
 (property LOC (string "P86")))
(instance LCD_DB_4_ibuf (viewref view_1 (cellRef IBUF))
 (property LOC (string "P84")))
(instance LCD_DB_3_ibuf (viewref view_1 (cellRef IBUF))
 (property LOC (string "P83")))
(instance LCD_DB_2_ibuf (viewref view_1 (cellRef IBUF))
 (property LOC (string "P82")))
(instance LCD_DB_1_ibuf (viewref view_1 (cellRef IBUF))
 (property LOC (string "P81")))
(instance LCD_DB_0_ibuf (viewref view_1 (cellRef IBUF))
 (property LOC (string "P75")))
(instance n3p (viewref view_1 (cellRef VCC)))
(instance TEST_BUTTON_ibuf (viewref view_1 (cellRef IBUF))
 (property LOC (string "P3")))
(instance JTAG_NEXUS_TDO_obuf (viewref view_1 (cellRef OBUF))
 (property LOC (string "P11")))
(instance KP_ROW_3_obuf (viewref view_1 (cellRef OBUF))
 (property LOC (string "P101")))
(instance KP_ROW_2_obuf (viewref view_1 (cellRef OBUF))
 (property LOC (string "P100")))
(instance KP_ROW_1_obuf (viewref view_1 (cellRef OBUF))
 (property LOC (string "P99")))
(instance KP_ROW_0_obuf (viewref view_1 (cellRef OBUF))
 (property LOC (string "P95")))
(instance LCD_E_obuf (viewref view_1 (cellRef OBUF))
 (property LOC (string "P89")))
(instance LCD_LIGHT_obuf (viewref view_1 (cellRef OBUF))
 (property LOC (string "P94")))
(instance LCD_RS_obuf (viewref view_1 (cellRef OBUF))
 (property LOC (string "P164")))
(instance LCD_RW_obuf (viewref view_1 (cellRef OBUF))
 (property LOC (string "P166")))
(instance SPEAKER_obuf (viewref view_1 (cellRef OBUF))
 (property LOC (string "P93")))
(instance n3q (viewref view_1 (cellRef BUFG)))
(instance n3r (viewref view_1 (cellRef BUFG)))
(instance U1 (viewref view_1 (cellRef LCD16X2A))
 (property HDL_SOURCE (string "FPGA_51_C_165B_ASM_Buzzer.VHD : 246")))
(instance U2 (viewref view_1 (cellRef FPGA_STARTUP8))
```

```
      (property HDL_SOURCE (string "FPGA_51_C_165B_ASM_Buzzer.VHD : 238")))
(instance U3 (viewref view_1 (cellRef OR2N1S))
      (property HDL_SOURCE (string "FPGA_51_C_165B_ASM_Buzzer.VHD : 230")))
(instance S1 (viewref view_1 (cellRef Buzzer))
      (property HDL_SOURCE (string "FPGA_51_C_165B_ASM_Buzzer.VHD : 201")))
(instance S2 (viewref view_1 (cellRef Keypad))
      (property HDL_SOURCE (string "FPGA_51_C_165B_ASM_Buzzer.VHD : 185")))
(instance U6 (viewref view_1 (cellRef IOBUF8B))
      (property HDL_SOURCE (string "FPGA_51_C_165B_ASM_Buzzer.VHD : 221")))
(net CLK_BRD_ibuf (joined
    (portRef O  (instanceRef CLK_BRD_ibuf))
    (portRef I  (instanceRef n3r))))
(net JTAG_NEXUS_TCK_ibuf (joined
    (portRef O  (instanceRef JTAG_NEXUS_TCK_ibuf))
    (portRef I  (instanceRef n3q))))
(net JTAG_NEXUS_TDI_ibuf (joined
    (portRef O  (instanceRef JTAG_NEXUS_TDI_ibuf))
    (portRef JTAG_NEXUS_TDI   (instanceRef S1))))
(net JTAG_NEXUS_TMS_ibuf (joined
    (portRef O  (instanceRef JTAG_NEXUS_TMS_ibuf))
    (portRef JTAG_NEXUS_TMS   (instanceRef S2))
    (portRef JTAG_NEXUS_TMS   (instanceRef S1))))
(net KP_COL_3_ibuf (joined
    (portRef O  (instanceRef KP_COL_3_ibuf))
    (portRef INA_3   (instanceRef S2))))
(net KP_COL_2_ibuf (joined
    (portRef O  (instanceRef KP_COL_2_ibuf))
    (portRef INA_2   (instanceRef S2))))
(net KP_COL_1_ibuf (joined
    (portRef O  (instanceRef KP_COL_1_ibuf))
    (portRef INA_1   (instanceRef S2))))
(net KP_COL_0_ibuf (joined
    (portRef O  (instanceRef KP_COL_0_ibuf))
    (portRef INA_0   (instanceRef S2))))
(net LCD_DB_7_ibuf (joined
    (portRef O  (instanceRef LCD_DB_7_ibuf))
    (portRef IO__IN_7   (instanceRef U6))))
(net LCD_DB_6_ibuf (joined
    (portRef O  (instanceRef LCD_DB_6_ibuf))
    (portRef IO__IN_6   (instanceRef U6))))
(net LCD_DB_5_ibuf (joined
    (portRef O  (instanceRef LCD_DB_5_ibuf))
    (portRef IO__IN_5   (instanceRef U6))))
(net LCD_DB_4_ibuf (joined
    (portRef O  (instanceRef LCD_DB_4_ibuf))
    (portRef IO__IN_4   (instanceRef U6))))
(net LCD_DB_3_ibuf (joined
    (portRef O  (instanceRef LCD_DB_3_ibuf))
    (portRef IO__IN_3   (instanceRef U6))))
(net LCD_DB_2_ibuf (joined
    (portRef O  (instanceRef LCD_DB_2_ibuf))
    (portRef IO__IN_2   (instanceRef U6))))
(net LCD_DB_1_ibuf (joined
    (portRef O  (instanceRef LCD_DB_1_ibuf))
```

```
    (portRef IO_IN_1   (instanceRef U6))))
(net LCD_DB_0_ibuf (joined
    (portRef O   (instanceRef LCD_DB_0_ibuf))
    (portRef IO_IN_0   (instanceRef U6))))
(net n3p (joined
    (portRef P   (instanceRef n3p))
    (portRef I   (instanceRef LCD_LIGHT_obuf))
    (portRef JTAG_NEXUS_TRST   (instanceRef S2))
    (portRef JTAG_NEXUS_TRST   (instanceRef S1))
    (portRef (member DELAY 0)   (instanceRef U2))
    (portRef (member DELAY 1)   (instanceRef U2))
    (portRef (member DELAY 2)   (instanceRef U2))
    (portRef (member DELAY 3)   (instanceRef U2))
    (portRef (member DELAY 4)   (instanceRef U2))
    (portRef (member DELAY 5)   (instanceRef U2))
    (portRef (member DELAY 6)   (instanceRef U2))
    (portRef (member DELAY 7)   (instanceRef U2))))
(net TEST_BUTTON_ibuf (joined
    (portRef O   (instanceRef TEST_BUTTON_ibuf))
    (portRef IO   (instanceRef U3))))
(net PinSignal_S1_JTAG_NEXUS_TDO (joined
    (portRef JTAG_NEXUS_TDO   (instanceRef S1))
    (portRef JTAG_NEXUS_TDI   (instanceRef S2))))
(net PinSignal_U3_O (joined
    (portRef O   (instanceRef U3))
    (portRef RST   (instanceRef U1))
    (portRef RST   (instanceRef S2))
    (portRef RST   (instanceRef S1))))
(net PinSignal_U1_BUSY (joined
    (portRef BUSY   (instanceRef U1))
    (portRef BUSY   (instanceRef S1))))
(net PinSignal_S2_OUTB_7 (joined
    (portRef OUTB_7   (instanceRef S2))
    (portRef PAI_7   (instanceRef S1))))
(net PinSignal_S2_OUTB_6 (joined
    (portRef OUTB_6   (instanceRef S2))
    (portRef PAI_6   (instanceRef S1))))
(net PinSignal_S2_OUTB_5 (joined
    (portRef OUTB_5   (instanceRef S2))
    (portRef PAI_5   (instanceRef S1))))
(net PinSignal_S2_OUTB_4 (joined
    (portRef OUTB_4   (instanceRef S2))
    (portRef PAI_4   (instanceRef S1))))
(net PinSignal_S2_OUTB_3 (joined
    (portRef OUTB_3   (instanceRef S2))
    (portRef PAI_3   (instanceRef S1))))
(net PinSignal_S2_OUTB_2 (joined
    (portRef OUTB_2   (instanceRef S2))
    (portRef PAI_2   (instanceRef S1))))
(net PinSignal_S2_OUTB_1 (joined
    (portRef OUTB_1   (instanceRef S2))
    (portRef PAI_1   (instanceRef S1))))
(net PinSignal_S2_OUTB_0 (joined
    (portRef OUTB_0   (instanceRef S2))
```

```
    (portRef PAI_0   (instanceRef S1))))
(net PinSignal_S2_OUTC_7 (joined
    (portRef OUTC_7  (instanceRef S2))
    (portRef PBI_7   (instanceRef S1))))
(net PinSignal_S2_OUTC_6 (joined
    (portRef OUTC_6  (instanceRef S2))
    (portRef PBI_6   (instanceRef S1))))
(net PinSignal_S2_OUTC_5 (joined
    (portRef OUTC_5  (instanceRef S2))
    (portRef PBI_5   (instanceRef S1))))
(net PinSignal_S2_OUTC_4 (joined
    (portRef OUTC_4  (instanceRef S2))
    (portRef PBI_4   (instanceRef S1))))
(net PinSignal_S2_OUTC_3 (joined
    (portRef OUTC_3  (instanceRef S2))
    (portRef PBI_3   (instanceRef S1))))
(net PinSignal_S2_OUTC_2 (joined
    (portRef OUTC_2  (instanceRef S2))
    (portRef PBI_2   (instanceRef S1))))
(net PinSignal_S2_OUTC_1 (joined
    (portRef OUTC_1  (instanceRef S2))
    (portRef PBI_1   (instanceRef S1))))
(net PinSignal_S2_OUTC_0 (joined
    (portRef OUTC_0  (instanceRef S2))
    (portRef PBI_0   (instanceRef S1)))).
(net PinSignal_U1_LCD_DATAO_7 (joined
    (portRef (member LCD_DATAO 0)  (instanceRef U1))
    (portRef I_7   (instanceRef U6))))
(net PinSignal_U1_LCD_DATAO_6 (joined
    (portRef (member LCD_DATAO 1)  (instanceRef U1))
    (portRef I_6   (instanceRef U6))))
(net PinSignal_U1_LCD_DATAO_5 (joined
    (portRef (member LCD_DATAO 2)  (instanceRef U1))
    (portRef I_5   (instanceRef U6))))
(net PinSignal_U1_LCD_DATAO_4 (joined
    (portRef (member LCD_DATAO 3)  (instanceRef U1))
    (portRef I_4   (instanceRef U6))))
(net PinSignal_U1_LCD_DATAO_3 (joined
    (portRef (member LCD_DATAO 4)  (instanceRef U1))
    (portRef I_3   (instanceRef U6))))
(net PinSignal_U1_LCD_DATAO_2 (joined
    (portRef (member LCD_DATAO 5)  (instanceRef U1))
    (portRef I_2   (instanceRef U6))))
(net PinSignal_U1_LCD_DATAO_1 (joined
    (portRef (member LCD_DATAO 6)  (instanceRef U1))
    (portRef I_1   (instanceRef U6))))
(net PinSignal_U1_LCD_DATAO_0 (joined
    (portRef (member LCD_DATAO 7)  (instanceRef U1))
    (portRef I_0   (instanceRef U6))))
(net PinSignal_U1_LCD_DATA_TRI (joined
    (portRef LCD_DATA_TRI   (instanceRef U1))
    (portRef T   (instanceRef U6))))
(net PinSignal_U2_INIT (joined
    (portRef INIT   (instanceRef U2))
```

```
      (portRef I1   (instanceRef U3))))
(net PinSignal_S1_ADDR_3 (joined
   (portRef ADDR_3   (instanceRef S1))
   (portRef (member ADDR 0)   (instanceRef U1))))
(net PinSignal_S1_ADDR_2 (joined
   (portRef ADDR_2   (instanceRef S1))
   (portRef (member ADDR 1)   (instanceRef U1))))
(net PinSignal_S1_ADDR_1 (joined
   (portRef ADDR_1   (instanceRef S1))
   (portRef (member ADDR 2)   (instanceRef U1))))
(net PinSignal_S1_ADDR_0 (joined
   (portRef ADDR_0   (instanceRef S1))
   (portRef (member ADDR 3)   (instanceRef U1))))
(net PinSignal_S1_DATA_7 (joined
   (portRef DATA_7   (instanceRef S1))
   (portRef (member DATA 0)   (instanceRef U1))))
(net PinSignal_S1_DATA_6 (joined
   (portRef DATA_6   (instanceRef S1))
   (portRef (member DATA 1)   (instanceRef U1))))
(net PinSignal_S1_DATA_5 (joined
   (portRef DATA_5   (instanceRef S1))
   (portRef (member DATA 2)   (instanceRef U1))))
(net PinSignal_S1_DATA_4 (joined
   (portRef DATA_4   (instanceRef S1))
   (portRef (member DATA 3)   (instanceRef U1))))
(net PinSignal_S1_DATA_3 (joined
   (portRef DATA_3   (instanceRef S1))
   (portRef (member DATA 4)   (instanceRef U1))))
(net PinSignal_S1_DATA_2 (joined
   (portRef DATA_2   (instanceRef S1))
   (portRef (member DATA 5)   (instanceRef U1))))
(net PinSignal_S1_DATA_1 (joined
   (portRef DATA_1   (instanceRef S1))
   (portRef (member DATA 6)   (instanceRef U1))))
(net PinSignal_S1_DATA_0 (joined
   (portRef DATA_0   (instanceRef S1))
   (portRef (member DATA 7)   (instanceRef U1))))
(net PinSignal_U6_O_7 (joined
   (portRef O_7   (instanceRef U6))
   (portRef (member LCD_DATAI 0)   (instanceRef U1))))
(net PinSignal_U6_O_6 (joined
   (portRef O_6   (instanceRef U6))
   (portRef (member LCD_DATAI 1)   (instanceRef U1))))
(net PinSignal_U6_O_5 (joined
   (portRef O_5   (instanceRef U6))
   (portRef (member LCD_DATAI 2)   (instanceRef U1))))
(net PinSignal_U6_O_4 (joined
   (portRef O_4   (instanceRef U6))
   (portRef (member LCD_DATAI 3)   (instanceRef U1))))
(net PinSignal_U6_O_3 (joined
   (portRef O_3   (instanceRef U6))
   (portRef (member LCD_DATAI 4)   (instanceRef U1))))
(net PinSignal_U6_O_2 (joined
   (portRef O_2   (instanceRef U6))
```

```
      (portRef (member LCD_DATAI 5)  (instanceRef U1))))
(net PinSignal_U6_O_1 (joined
   (portRef O_1   (instanceRef U6))
   (portRef (member LCD_DATAI 6)  (instanceRef U1))))
(net PinSignal_U6_O_0 (joined
   (portRef O_0   (instanceRef U6))
   (portRef (member LCD_DATAI 7)  (instanceRef U1))))
(net PinSignal_S1_LINE (joined
   (portRef LINE   (instanceRef S1))
   (portRef LINE   (instanceRef U1))))
(net PinSignal_S1_STROBE (joined
   (portRef STROBE   (instanceRef S1))
   (portRef STROBE   (instanceRef U1))))
(net JTAG_NEXUS_TDO_int (joined
   (portRef JTAG_NEXUS_TDO   (instanceRef S2))
   (portRef I   (instanceRef JTAG_NEXUS_TDO_obuf))))
(net KP_ROW_3_int (joined
   (portRef OUTA_3   (instanceRef S2))
   (portRef I   (instanceRef KP_ROW_3_obuf))))
(net KP_ROW_2_int (joined
   (portRef OUTA_2   (instanceRef S2))
   (portRef I   (instanceRef KP_ROW_2_obuf))))
(net KP_ROW_1_int (joined
   (portRef OUTA_1   (instanceRef S2))
   (portRef I   (instanceRef KP_ROW_1_obuf))))
(net KP_ROW_0_int (joined
   (portRef OUTA_0   (instanceRef S2))
   (portRef I   (instanceRef KP_ROW_0_obuf))))
(net (rename LCD_DB_7 "LCD_DB<7>") (joined
   (portRef IO_7   (instanceRef U6))
   (portRef (member LCD_DB 0))
   (portRef I   (instanceRef LCD_DB_7_ibuf))))
(net (rename LCD_DB_6 "LCD_DB<6>") (joined
   (portRef IO_6   (instanceRef U6))
   (portRef (member LCD_DB 1))
   (portRef I   (instanceRef LCD_DB_6_ibuf))))
(net (rename LCD_DB_5 "LCD_DB<5>") (joined
   (portRef IO_5   (instanceRef U6))
   (portRef (member LCD_DB 2))
   (portRef I   (instanceRef LCD_DB_5_ibuf))))
(net (rename LCD_DB_4 "LCD_DB<4>") (joined
   (portRef IO_4   (instanceRef U6))
   (portRef (member LCD_DB 3))
   (portRef I   (instanceRef LCD_DB_4_ibuf))))
(net (rename LCD_DB_3 "LCD_DB<3>") (joined
   (portRef IO_3   (instanceRef U6))
   (portRef (member LCD_DB 4))
   (portRef I   (instanceRef LCD_DB_3_ibuf))))
(net (rename LCD_DB_2 "LCD_DB<2>") (joined
   (portRef IO_2   (instanceRef U6))
   (portRef (member LCD_DB 5))
   (portRef I   (instanceRef LCD_DB_2_ibuf))))
(net (rename LCD_DB_1 "LCD_DB<1>") (joined
   (portRef IO_1   (instanceRef U6))
```

```
    (portRef (member LCD_DB 6))
    (portRef I   (instanceRef LCD_DB_1_ibuf))))
(net (rename LCD_DB_0 "LCD_DB<0>") (joined
    (portRef IO_0   (instanceRef U6))
    (portRef (member LCD_DB 7))
    (portRef I   (instanceRef LCD_DB_0_ibuf))))
(net LCD_E_int (joined
    (portRef LCD_E   (instanceRef U1))
    (portRef I   (instanceRef LCD_E_obuf))))
(net LCD_RS_int (joined
    (portRef LCD_RS   (instanceRef U1))
    (portRef I   (instanceRef LCD_RS_obuf))))
(net LCD_RW_int (joined
    (portRef LCD_RW   (instanceRef U1))
    (portRef I   (instanceRef LCD_RW_obuf))))
(net SPEAKER_int (joined
    (portRef SPEAKER   (instanceRef S1))
    (portRef I   (instanceRef SPEAKER_obuf))))
(net JTAG_NEXUS_TDO (joined
    (portRef O   (instanceRef JTAG_NEXUS_TDO_obuf))
    (portRef JTAG_NEXUS_TDO)))
(net (rename KP_ROW_3 "KP_ROW<3>") (joined
    (portRef O   (instanceRef KP_ROW_3_obuf))
    (portRef (member KP_ROW 0))))
(net (rename KP_ROW_2 "KP_ROW<2>") (joined
    (portRef O   (instanceRef KP_ROW_2_obuf))
    (portRef (member KP_ROW 1))))
(net (rename KP_ROW_1 "KP_ROW<1>") (joined
    (portRef O   (instanceRef KP_ROW_1_obuf))
    (portRef (member KP_ROW 2))))
(net (rename KP_ROW_0 "KP_ROW<0>") (joined
    (portRef O   (instanceRef KP_ROW_0_obuf))
    (portRef (member KP_ROW 3))))
(net LCD_E (joined
    (portRef O   (instanceRef LCD_E_obuf))
    (portRef LCD_E)))
(net LCD_LIGHT (joined
    (portRef O   (instanceRef LCD_LIGHT_obuf))
    (portRef LCD_LIGHT)))
(net LCD_RS (joined
    (portRef O   (instanceRef LCD_RS_obuf))
    (portRef LCD_RS)))
(net LCD_RW (joined
    (portRef O   (instanceRef LCD_RW_obuf))
    (portRef LCD_RW)))
(net SPEAKER (joined
    (portRef O   (instanceRef SPEAKER_obuf))
    (portRef SPEAKER)))
(net n3q (joined
    (portRef O   (instanceRef n3q))
    (portRef JTAG_NEXUS_TCK   (instanceRef S2))
    (portRef JTAG_NEXUS_TCK   (instanceRef S1))))
(net n3r (joined
    (portRef O   (instanceRef n3r))
```

```
        (portRef CLK   (instanceRef U1))
        (portRef CLK   (instanceRef U2))
        (portRef CLK   (instanceRef S2))
        (portRef CLK   (instanceRef S1))))
      (net CLK_BRD (joined
        (portRef CLK_BRD)
        (portRef I   (instanceRef CLK_BRD_ibuf))))
      (net JTAG_NEXUS_TCK (joined
        (portRef JTAG_NEXUS_TCK)
        (portRef I   (instanceRef JTAG_NEXUS_TCK_ibuf))))
      (net JTAG_NEXUS_TDI (joined
        (portRef JTAG_NEXUS_TDI)
        (portRef I   (instanceRef JTAG_NEXUS_TDI_ibuf))))
      (net JTAG_NEXUS_TMS (joined
        (portRef JTAG_NEXUS_TMS)
        (portRef I   (instanceRef JTAG_NEXUS_TMS_ibuf))))
      (net (rename KP_COL_3 "KP_COL<3>") (joined
        (portRef (member KP_COL 0))
        (portRef I   (instanceRef KP_COL_3_ibuf))))
      (net (rename KP_COL_2 "KP_COL<2>") (joined
        (portRef (member KP_COL 1))
        (portRef I   (instanceRef KP_COL_2_ibuf))))
      (net (rename KP_COL_1 "KP_COL<1>") (joined
        (portRef (member KP_COL 2))
        (portRef I   (instanceRef KP_COL_1_ibuf))))
      (net (rename KP_COL_0 "KP_COL<0>") (joined
        (portRef (member KP_COL 3))
        (portRef I   (instanceRef KP_COL_0_ibuf))))
      (net TEST_BUTTON (joined
        (portRef TEST_BUTTON)
        (portRef I   (instanceRef TEST_BUTTON_ibuf))))))))
 (design FPGA_51_C_165B_ASM_Buzzer (cellRef FPGA_51_C_165B_ASM_Buzzer
(libraryRef Xilinx))))
```

The re-programmable digital platform design system 10 and method in accordance with the various embodiments of the present invention have wide applicability across the electronics industry, and are beneficial in many industries, where product value is relatively high, but market size does not allow conventional ASIC development. The re-programmable digital platform design system 10 and method provide immediate benefits to:

Engineers who routinely develop digital systems using off-the-shelf silicon devices, because the re-programmable digital platform design system 10 and method provide an intuitive approach for migrating board-level systems into device-level designs;

FPGA designers looking for an easier way to embed soft processor cores into their designs, because the re-programmable digital platform design system 10 and method provide a reconfigurable development environment, the tools, and IP to support complete system implementation;

Hardware and software engineers designing low- to medium-complexity embedded microcontroller applications, because the re-programmable digital platform design system 10 and method integrate hardware and software development flows from the first line of code through board-level implementation.

The re-programmable digital platform design system 10 and method represent a new way of approaching digital design. In particular, the re-programmable digital platform design system 10 and method provide:

Shorter embedded systems development cycles by enabling parallel design of hardware and software;

Greater flexibility in hardware/software design partitioning;

An integrated solution for putting entire embedded systems into FPGAs;

The benefits of chip-level integration to all users, irrespective of their HDL knowledge and expertise;

An ASIC alternative to high-cost factory ASIC implementation;

An FPGA vendor-independent solution to systems design; and

A "live,", interactive environment for system-on-FPGA development and debug.

While the foregoing description has been with reference to particular embodiments of the present invention, it will be appreciated by those skilled in the art that changes in these embodiments may be made without departing from the principles and spirit of the invention. Accordingly, the scope of the present invention can only be ascertained with reference to the appended claims.

What is claimed is:

1. A method for digital circuit design to enable a user to build a digital circuit design without the requirement for advanced HDL knowledge and expertise, comprising the steps of:

placing and wiring schematic components directly within a design capture environment;

instantiating the components into a digital circuit design by the user;

targeting the digital circuit design to a re-programmable device;

providing models for generic, vendor-independent components;

storing the models in a hierarchy of folders according to vendor and device family;

enabling a target re-programmable device to be changed at any time during the design; and re-linking all generic component symbols to relevant pre-synthesized EDIF models for the device, found within the folders;

thereby enabling the user to design by placing generic schematic symbols to produce a digital circuit design as well as enabling vendor independency.

2. The method of claim 1, further comprising the step of:

providing pre-synthesized components as object code entities without having to expose underlying RTL-level source code.

3. The method of claim 1, further comprising the step of:

providing multiple libraries comprising a comprehensive set of pre-synthesized components, ranging from simple gate-level functional blocks, up through high-level hardware, and high-level functions.

4. The method of claim 1, further comprising the step of:

automatically re-targeting a generic design for a selected re-programmable device.

5. The method of claim 1, wherein the re-programmable device is an FPGA, further comprising the steps of:

using a single Process Flow when processing a captured FPGA circuit design, the Process Flow consisting of four stages: 1) Compile for compiling the FPGA circuit design, 2) Synthesize for synthesizing the FPGA circuit design, 3) Build to construct the FPGA circuit design, and 4) Program FPGA to program the FPGA circuit design.

6. The method of claim 1, further comprising the step of:

automatically managing device-specific design constraints associated with implementation data.

7. The method of claim 6, further comprising the step of:

storing the implementation data separate from source design documents;

thereby re-targeting the same design to a different physical FPGA device, allowing design portability.

8. The method of claim 1, further comprising the step of:

providing a generic boot system capable of supporting multiple re-programmable device architectures.

9. The method of claim 8 wherein the generic boot system provides support to program, at power-up, multiple re-programmable device architectures from different vendors.

10. The method of claim 8 wherein the boot system comprises a controller and a generic low-cost serial flash RAM device, and further comprising the step of storing in the flash RAM configuration data, wherein a type of re-programmable device from multiple vendors installed on a daughter board is read via an identification code from the daughter board and based on the identification, the configuration data from the flash RAM is used to select a correct programming algorithm to program the re-programmable device.

11. A method for digital circuit design to enable a user to build a digital circuit design without the requirement for advanced HDL knowledge and expertise, comprising the steps of:

placing and wiring schematic components directly within a design capture environment;

instantiating the components into a digital circuit design by the user;

targeting the digital circuit design to a re-programmable device;

providing models for generic, vendor-independent components;

storing the models in a hierarchy of folders according to vendor and device family;

providing user-created pre-synthesized EDIF models; and storing the user-created models in one of a single user model folder or in a hierarchy of folders if the user is developing a model for multiple target devices;

thereby enabling the user to design by placing generic schematic symbols to produce a digital circuit design.

12. The method of claim 11, further comprising the step of:

providing pre-synthesized components as object code entities without having to expose underlying RTL-level source code.

13. The method of claim 11, further comprising the step of:

providing multiple libraries comprising a comprehensive set of pre-synthesized components, ranging from simple gate-level functional blocks, up through high-level hardware, and high-level functions.

14. The method of claim 11, further comprising the step of:

automatically re-targeting a generic design for a selected re-programmable device.

15. The method of claim 11, wherein the re-programmable programmable device is an FPGA, further comprising the steps of:

using a single Process Flow when processing a captured FPGA circuit design, the Process Flow consisting of four stages: 1) Compile for compiling the FPGA circuit design, 2) Synthesize for synthesizing the FPGA circuit design, 3) Build to construct the FPGA circuit design, and 4) Program FPGA to program the FPGA circuit design.

16. The method of claim 11, further comprising the step of:

automatically managing device-specific design constraints associated with implementation data.

17. The method of claim 16, further comprising the step of:

storing the implementation data separate from source design documents;

thereby re-targeting the same design to a different physical FPGA device, allowing design portability.

18. A method for digital circuit design to enable a user to build a digital circuit design without the requirement for advanced HDL knowledge and expertise, comprising the steps of:

placing and wiring schematic components directly within a design capture environment;

instantiating the components into a digital circuit design by the user;

targeting the digital circuit design to a re-programmable device; and providing a development platform for interactive, re-targetable hardware/software co-design of a re-programmable device wherein the development platform comprises a socket for installing various daughter boards, each of which houses a physical device that is to be used for development;

thereby enabling the user to design by placing generic schematic symbols to produce a digital circuit design and allowing a single development platform to provide development resources for an unlimited number of target devices from one or more different semiconductor manufacturers.

19. The method of claim 18 wherein each daughter board generates an identification code that is read by a controller, which can then program the physical device at power-up.

20. The method of claim 18, further comprising the step of controlling a clock frequency of the re-programmable device using host-based development software.

21. The method of claim 18, further comprising the step of providing a programmable power supply on the development platform for accommodating daughter boards with different power rail requirements.

22. A method for digital circuit design to enable a user to build a digital circuit design without the requirement for advanced HDL knowledge and expertise, comprising the steps of:

placing and wiring schematic components directly within a design capture environment;

instantiating the components into a digital circuit design by the user;

targeting the digital circuit design to a re-programmable device;

providing a development platform for interactive, re-targetable hardware/software co-design of a re-programmable device;

interconnecting a plurality of development platforms; and employing a single pin on a header to detect and allow another development platform with JTAG devices to be automatically brought into a main JTAG chain;

thereby enabling the user to design by placing generic schematic symbols to produce a digital circuit design and allowing a single development platform to provide development resources for an unlimited number of target devices from one or more different semiconductor manufacturers.

23. The method of claim 22, further comprising the step of providing a single set of wires to handle multiple multiplexed JTAG and SPI communication channels.

24. The method of claim 22, further comprising the step of controlling a clock frequency of the re-programmable device using host-based development software.

* * * * *